US012701903B2

(12) United States Patent
Shim et al.

(10) Patent No.: US 12,701,903 B2
(45) Date of Patent: Aug. 4, 2026

(54) LIGHT EMITTING DISPLAY DEVICE

(71) Applicant: LG Display Co., Ltd., Seoul (KR)

(72) Inventors: Sungbin Shim, Paju-si (KR); Sangpil Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 430 days.

(21) Appl. No.: 18/474,557

(22) Filed: Sep. 26, 2023

(65) Prior Publication Data

US 2024/0138232 A1    Apr. 25, 2024
US 2024/0237480 A9    Jul. 11, 2024

(30) Foreign Application Priority Data

Oct. 25, 2022    (KR) ......................... 10-2022-0138671

(51) Int. Cl.
H10K 59/80        (2023.01)
H10K 59/122       (2023.01)

(52) U.S. Cl.
CPC ..... H10K 59/80522 (2023.02); H10K 59/122 (2023.02)

(58) Field of Classification Search
CPC ........... H10K 59/80522; H10K 59/122; H10K 50/824; H10K 2102/3026; H10K 59/1201; H10K 59/1315; H10K 59/131; H10K 50/82; H10K 50/84; H10K 59/12; H10K 59/80; H10K 59/8052; H10K 50/81; H10K 50/822; H10K 59/123; H10K 59/124; G09F 9/33; G09F 9/335; H10H 20/83; H10H 20/84; H10H 20/857; H10H 29/142
See application file for complete search history.

(56) References Cited

U.S. PATENT DOCUMENTS

| | | | |
|---|---|---|---|
| 10,403,845 B2 | 9/2019 | Lee et al. | |
| 10,418,430 B2 | 9/2019 | Choi et al. | |
| 10,510,818 B2 * | 12/2019 | Lu ........................... | H10D 86/60 |
| 10,998,395 B2 | 5/2021 | Han et al. | |
| 2019/0189717 A1 | 6/2019 | Choi et al. | |
| 2019/0198799 A1 | 6/2019 | Lee et al. | |
| 2020/0135838 A1 | 4/2020 | Han et al. | |

(Continued)

FOREIGN PATENT DOCUMENTS

| | | |
|---|---|---|
| CN | 111129080 A | 5/2020 |
| CN | 113327937 A | 8/2021 |

(Continued)

OTHER PUBLICATIONS

Intellectual Property Office of the United Kingdom, Combined Search and Examination Report, United Kingdom Patent Application No. GB2409452.6, Jul. 22, 2024, five pages.

(Continued)

*Primary Examiner* — Fernando L Toledo
*Assistant Examiner* — Shawn Shaw Muslim
(74) *Attorney, Agent, or Firm* — Fenwick & West LLP

(57) ABSTRACT

A light emitting display device includes a circuit layer including an auxiliary power electrode disposed on a substrate, at least one protection layer covering the circuit layer, a contact portion passing through the at least one protection layer to expose a portion of the auxiliary power electrode, and a metal pattern disposed on the contact portion and the at least one protection layer at a periphery of the contact portion.

20 Claims, 11 Drawing Sheets

(56) References Cited

U.S. PATENT DOCUMENTS

| 2021/0202655 | A1 | 7/2021 | Cho et al. |
| 2021/0202889 | A1 | 7/2021 | Lee et al. |
| 2022/0209173 | A1 | 6/2022 | Jung |

FOREIGN PATENT DOCUMENTS

| EP | 3331045 | A1 | 6/2018 |
| JP | 2019-121598 | A | 7/2019 |
| KR | 10-2021-0086064 | A | 7/2021 |
| KR | 10-2021-0086869 | A | 7/2021 |
| KR | 10-2387343 | B1 | 4/2022 |
| KR | 10-2022-0097210 | A | 7/2022 |
| WO | WO 2021/103223 | A1 | 6/2021 |

OTHER PUBLICATIONS

Intellectual Property Office of the United Kingdom, Examination Report, United Kingdom Patent Application No. GB2314536.0, Jul. 23, 2024, four pages.
Intellectual Property Office of the United Kingdom, Combined Search and Examination Report, United Kingdom Patent Application No. GB2314536.0, Mar. 12, 2024, eight pages.
Ministry of Intellectual Property of Korea, Office Action, Korean Patent Application No. 10-2022-0138671, Feb. 20, 2026, 22 pages.

* cited by examiner

LIGHT EMITTING DISPLAY DEVICE

CROSS-REFERENCE TO RELATED APPLICATION

This application claims the benefit of Republic of Korea Patent Application No. 10-2022-0138671 filed on Oct. 25, 2022, which is hereby incorporated herein in its entirety.

BACKGROUND

Technical Field

The present disclosure relates to a light emitting display device.

Discussion of the Related Art

With the advancement of an information-oriented society, demands and requirements for display devices configured to display images have increased in many ways, and there has been an increase in the various types of devices available. Accordingly, display devices such as a Liquid Crystal Display (LCD), an organic light emitting display (OLED), a Micro Light Emitting Diode (Micro LED), a quantum dot display device (QD), or the like are now used.

Among these display devices, light emitting display devices are classified into an inorganic light emitting display devices and an organic light emitting display devices depending on a material of a light emitting layer. For example, the organic light emitting display device can be self-luminous, wherein holes and electrons are injected into an emission layer from an anode electrode for hole injection and a cathode electrode for an electron injection, and light is emitted when excitons in which the injected holes and electrons are combined fall from an excited state to a ground state, to thereby display an image.

The light emitting display device may be divided into a top emission type, a bottom emission type, or a dual emission type according to a direction in which light is emitted.

When the light emitting display device is the top emission type, a transparent electrode or a semi-transmissive electrode may be used as a cathode to emit light from the light emitting layer to an upper portion. The cathode electrode has a thin profile (or thickness) to improve transmittance, thereby increasing an electrical resistance. Particularly for large-sized light emitting display devices, a voltage drop may be greater as a distance from a voltage supplying pad increases, and this can cause problems of luminance non-uniformity of the light emitting display device.

In order to overcome the problem of voltage drop caused by the increase in resistance of the cathode electrode, a cathode contact structure having an undercut shape is proposed to electrically connect a separate auxiliary electrode to the cathode electrode.

The above content of the background technology may be retained for a deduction of the present disclosure by inventors or may be technology information learned by practice of embodiments of the present disclosure. However, the above content of the background technology may not be a prior art published to the general public before an application of the present disclosure.

SUMMARY

The cathode contact structure is implemented to increase a contact area between an auxiliary electrode and a cathode electrode, and to block a water transmission path caused by an undercut structure. The cathode contact structure has been implemented so that the undercut structure is formed in an island pattern, and an undercut region is formed all over an edge of the undercut structure. However, there can be a problem where a reduction in adhesive force between different material layers configuring the undercut structure may result in a peeling phenomenon.

Moreover, in the cathode contact structure, the undercut structure has been implemented by using a passivation layer and an overcoat layer each having relatively good adhesive characteristics so as to avoid a direct contact between a bank layer and the passivation layer. However, because an aperture ratio of the bank layer at a periphery of the undercut structure increases and a total area of the cathode contact structure increases, there can be a problem because an aperture ratio of a pixel is reduced.

An aspect of the present disclosure is directed to providing a light emitting display device in which a cathode contact area may uniformly increase and an area of a cathode contact structure may decrease.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light emitting display device including a circuit layer including an auxiliary power electrode disposed on a substrate, at least one protection layer covering the circuit layer, a contact portion passing through the at least one protection layer to expose a portion of the auxiliary power electrode, and a metal pattern disposed on the contact portion and the at least one protection layer at a periphery of the contact portion.

In another aspect of the present disclosure, there is provided a light emitting display device including a substrate including an emission region and a non-emission region, an auxiliary power electrode disposed in the non-emission region, an undercut structure disposed on a portion of the auxiliary power electrode to include an undercut region, a first protection layer covering the emission region and the auxiliary power electrode of the non-emission region and including a first opening portion exposing a portion of the auxiliary power electrode at a periphery of the undercut structure, a second protection layer disposed on the first protection layer, the second protection layer including a second opening portion which is greater than the first opening portion, a metal pattern disposed on the undercut structure, the first opening portion, and the second opening portion, and a bank layer disposed on the second protection layer, the bank layer including a third opening portion exposing a portion of the metal pattern contacting the auxiliary power electrode at the periphery of the undercut structure.

In a light emitting display device according to the present disclosure, an undercut structure in a cathode contact structure may be formed by using a passivation layer and an overcoat layer each having good adhesive characteristics and a metal pattern disposed between the passivation layer and a bank layer may be formed at a periphery of the undercut structure while covering the undercut structure, and thus, an opening region of the bank layer may decrease and a coverage characteristic of a cathode electrode and the structural stability of the undercut structure may be enhanced. Accordingly, in a light emitting display device according to the present disclosure, a cathode contact area may uniformly increase and an area of a cathode contact structure may decrease, and thus, an aperture ratio of a pixel may be enhanced and the display quality and reliability of a display device may be enhanced/improved.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
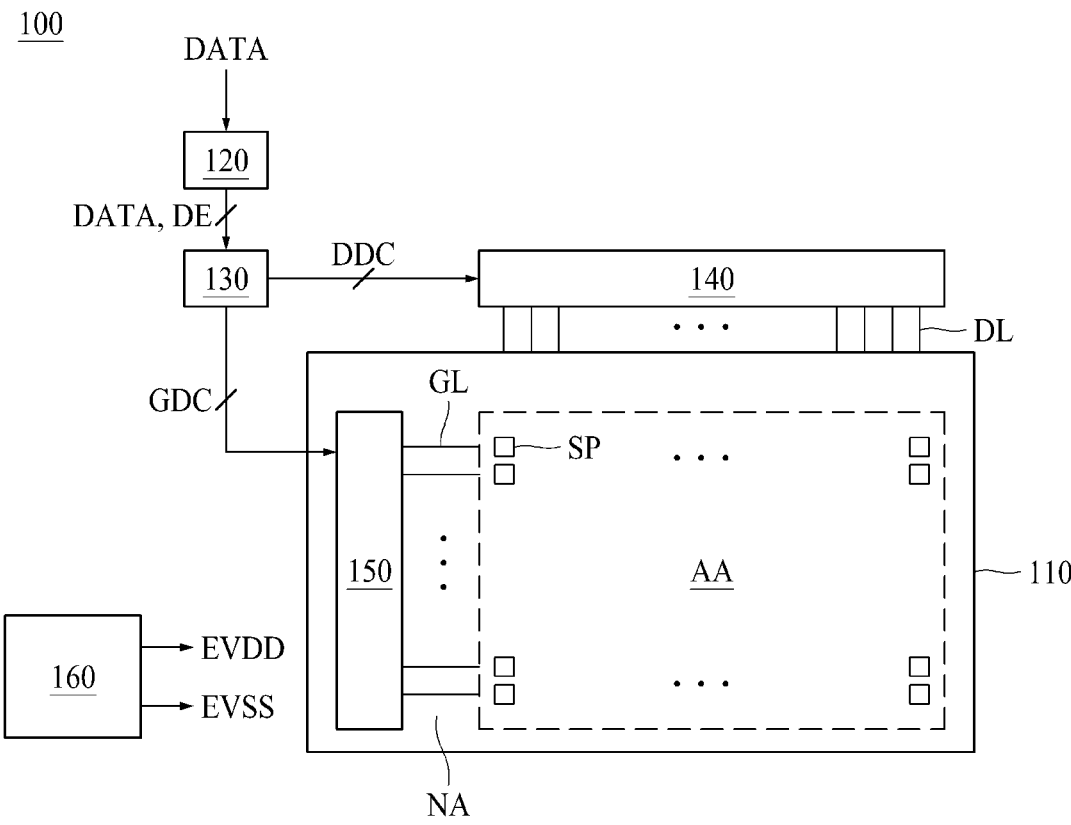
FIG. 1 is a block diagram schematically illustrating a light emitting display device according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present invention.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a preferred embodiment of a light emitting display device according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

FIG. 1 is a block diagram schematically illustrating a light emitting display device according to one embodiment of the present disclosure.

Referring to FIG. 1, the light emitting display device 100 according to one embodiment of the present disclosure may include a display panel 110, an image processor 120, a timing controller 130, a data driver 140, a scan driver 150, and a power supply portion 160 (also referred to as a power supply portion).

The display panel 110 may display an image corresponding to a data signal DATA supplied from the data driver 140, a scan signal supplied from the scan driver 150, and power supplied from the power supply portion 160.

The display panel 110 may include a sub pixel SP disposed at every intersection of a plurality of gate lines GL and a plurality of data lines DL. A structure of the sub pixel SP may vary depending on the type of the display device 100.

For example, the sub pixels SP may be formed in a top emission method, a bottom emission method, or a dual emission method according to the structure. The sub pixels SP refer to units capable of emitting light of their own color with or without a specific type of color filter. The sub pixels SP may include a red sub pixel, a green sub pixel, and a blue sub pixel. Alternatively, the sub pixel SP may include a red sub pixel, a blue sub pixel, a white sub pixel, and a green sub pixel. The sub pixels SP may have one or more other light emitting areas according to light emitting characteristics.

The one or more sub pixels SP may constitute one unit pixel. For example, one unit pixel may include red, green, and blue sub pixels, and the red, green, and blue sub pixels may be repeatedly arranged. Alternatively, one unit pixel may include red, green, blue, and white subpixels, wherein the red, green, blue and white subpixels may be repeatedly arranged, or the red, green, blue and white subpixels may be arranged in a quad type. In the embodiment according to the present disclosure, the color type, arrangement type, arrangement order, etc., of the sub pixels may be configured in various forms depending on the luminous characteristics, the lifespan of the device, the spec of the device, and the like, whereby it is not limited thereto.

The display panel 110 may be divided into a display area AA for displaying an image by arranging the sub pixels SP, and a non-display area NA around the display area AA. The scan driver 150 may be provided on the non-display area NA of the display panel 110. In addition, the non-display area NA may include a pad area.

The image processor 120 may output a data enable signal DE together with the data signal DATA supplied from the outside. The image processor 120 may output one or more of a vertical synchronization signal, a horizontal synchronization signal, and a clock signal in addition to the data enable signal DE.

The timing controller 130 may receive the data signal DATA as well as a driving signal from the image processor 120. The driving signal may include the data enable signal DE. Alternatively, the driving signal may include a vertical synchronization signal, a horizontal synchronization signal, and a clock signal. The timing controller 130 may output a data timing control signal DDC for controlling the operation timing of the data driver 140, and a gate timing control signal GDC for controlling the operation timing of the scan driver 150 based on the driving signal.

The data driver 140 may convert the data signal DATA into a gamma reference voltage by sampling and latching (signal locking) the data signal DATA supplied from the timing controller 130 in response to the data timing control signal DDC supplied from the timing controller 130, and may output the gamma reference voltage.

The data driver 140 may output the data signal DATA through the data lines DL. The data driver 140 may be implemented in the form of an integrated circuit IC. For example, the data driver 140 may be electrically connected to the pad area disposed in the non-display area NA of the display panel 110 through a flexible circuit film.

The scan driver 150 may output the scan signal in response to the gate timing control signal GDC supplied from the timing controller 130. The scan driver 150 may output the scan signal through the gate lines GL. The scan driver 150 may be implemented in the form of an integrated circuit IC or may be implemented in a gate-in-panel GIP scheme.

The power supply portion 160 may output a high potential voltage and a low potential voltage for driving the display panel 110. The power supply portion 160 may supply the high potential voltage to the display panel 110 through a first power line EVDD (driving power line or pixel power line), and may supply the low potential voltage to the display panel 110 through a second power line EVSS (auxiliary power line or common power line).

Figure 2:
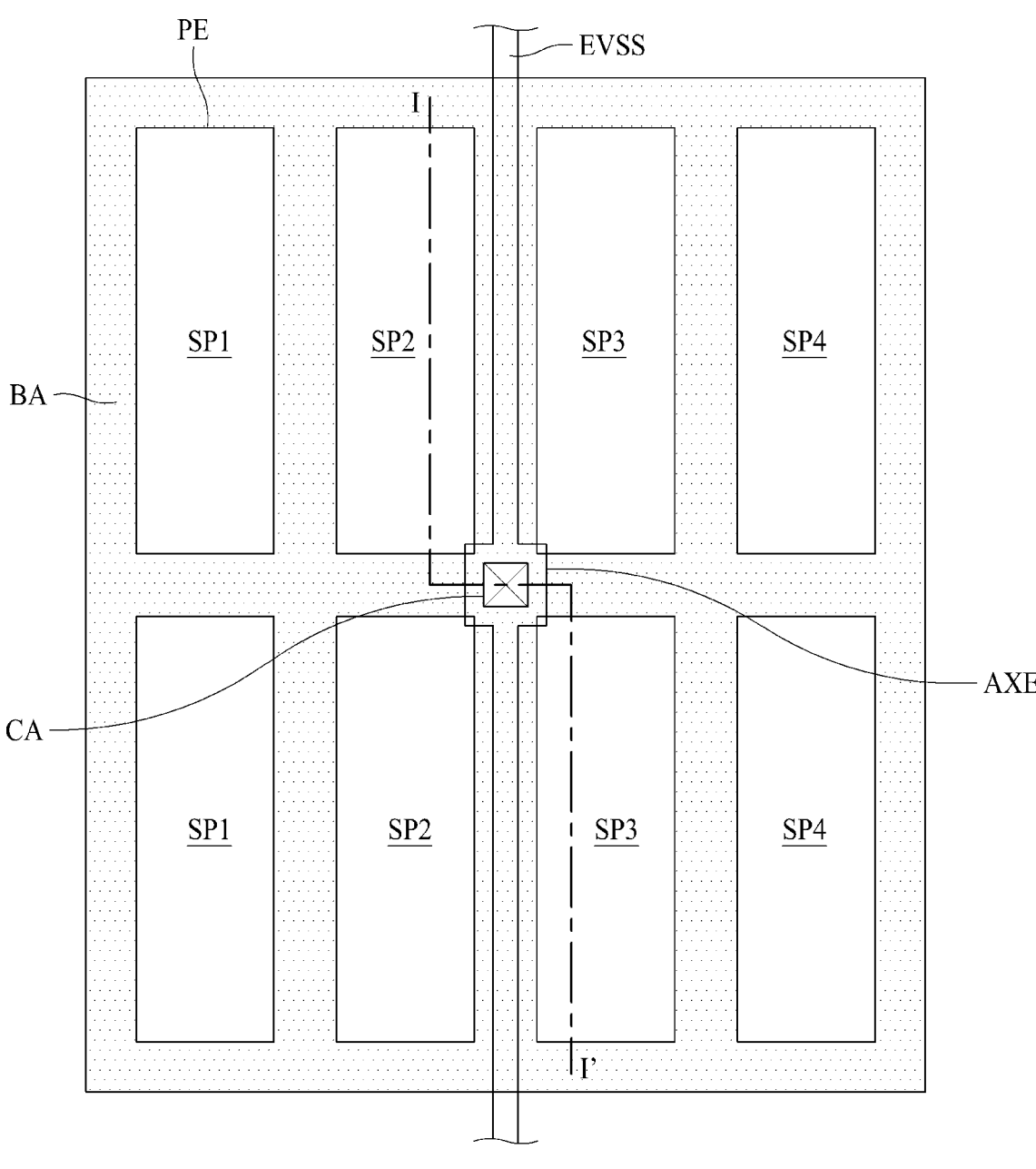
FIG. 2 is a diagram schematically illustrating a first electrode, an auxiliary power line, a bank layer, and a contact portion of each subpixel in a light emitting display device according to an embodiment of the present disclosure.

FIG. 2 is a plan view schematically illustrating a first electrode, an auxiliary power line, a bank layer, and a contact portion of sub pixels in the light emitting display device according to the embodiment of the present disclosure.

Referring to FIG. 2 in connection with FIG. 1, the display panel 110 of the light emitting display device 100 according to the embodiment of the present disclosure may be divided into the display area AA and the non-display area NA, and may include the plurality of sub pixels SP1, SP2, SP3, and SP4 defined by the intersection between the gate line GL and the data line DL on the substrate of the display area AA.

As shown in FIG. 2, the plurality of sub pixels SP1, SP2, SP3, and SP4 may include the first sub pixel SP1, the second sub pixel SP2, the third sub pixel SP3, and the fourth sub pixel SP4. For example, the first sub pixel SP1 may emit red light, the second sub pixel SP2 may emit green light, the third sub pixel SP3 may emit blue light, and the fourth sub pixel SP4 may emit white light, but not necessarily. It is possible to omit the fourth sub pixel SP4 for emitting white light. It is possible to configure the sub pixels emitting at least two of red light, green light, blue light, yellow light, magenta light, and cyan light. Also, the arrangement order of the sub pixels SP1, SP2, SP3, and SP4 may be variously changed.

A pixel electrode PE (or anode electrode or first electrode) may be disposed in each of the plurality of sub pixels SP1, SP2, SP3, and SP4. A bank layer BA covering (or overlaying) an edge portion of the pixel electrode PE and defining an opening corresponding to the plurality of sub pixels SP1, SP2, SP3, and SP4 may be disposed on the pixel electrode PE. Then, a light emitting layer (or organic light emitting layer) and a common electrode (or cathode electrode or second electrode) may be sequentially stacked on the pixel electrode PE and the bank layer BA.

According to an embodiment of the present disclosure, in order to decrease a resistance of a common electrode formed all over a front surface of a display panel 110, an auxiliary power line EVSS (a common power line or a second power line) transferring an auxiliary power (or a low level voltage) to the common electrode and an auxiliary power electrode AXE connecting the common electrode with the auxiliary power line EVSS may be provided.

The auxiliary power line EVSS may be disposed to extend in a first direction (or a lengthwise direction) of the display panel 110. For example, the auxiliary power line EVSS may be arranged in parallel with a data line DL. Alternatively, the auxiliary power line EVSS may be disposed as a mesh type which extends in the first direction (or the lengthwise direction) and a second direction (or a widthwise direction)

of the display panel 110, but embodiments of the present disclosure are not limited thereto.

The auxiliary power line EVSS may be disposed between adjacent subpixels SP. The auxiliary power line EVSS may be electrically connected with the common electrode through the auxiliary power electrode AXE and may transfer an auxiliary power to the common electrode through the auxiliary power electrode AXE.

The auxiliary power electrode AXE may be provided as one body with the auxiliary power line EVSS. The auxiliary power electrode AXE may include the same material as that of the auxiliary power line EVSS, or a different material. The auxiliary power electrode AXE may be formed of the same material on the same layer as the auxiliary power line EVSS. For example, the auxiliary power electrode AXE may be formed in a shape where a partial area of the auxiliary power line EVSS is enlarged, but embodiments of the present disclosure are not limited thereto. The auxiliary power electrode AXE may contact the common electrode and may be electrically connected with the common electrode, and thus, may supply the common electrode with an auxiliary power supplied through the auxiliary power line EVSS. A bank layer BA may define a contact portion CA which exposes a portion of the auxiliary power electrode AXE to electrically connect the auxiliary power electrode AXE with the common electrode.

The contact portion CA may be disposed between adjacent subpixels SP. For example, the contact portion CA may be provided for each of subpixels SP1 to SP4 configuring one unit pixel in a direction parallel to a gate line GL. Alternatively, the contact portion CA may be provided for each of an arbitrary plurality of subpixels. Alternatively, the contact portion CA may be provided for each horizontal line in a direction parallel to a data line DL. Alternatively, the contact portion CA may be formed for each of an arbitrary plurality of horizontal lines, but embodiments of the present disclosure are not limited thereto.

Figure 3:
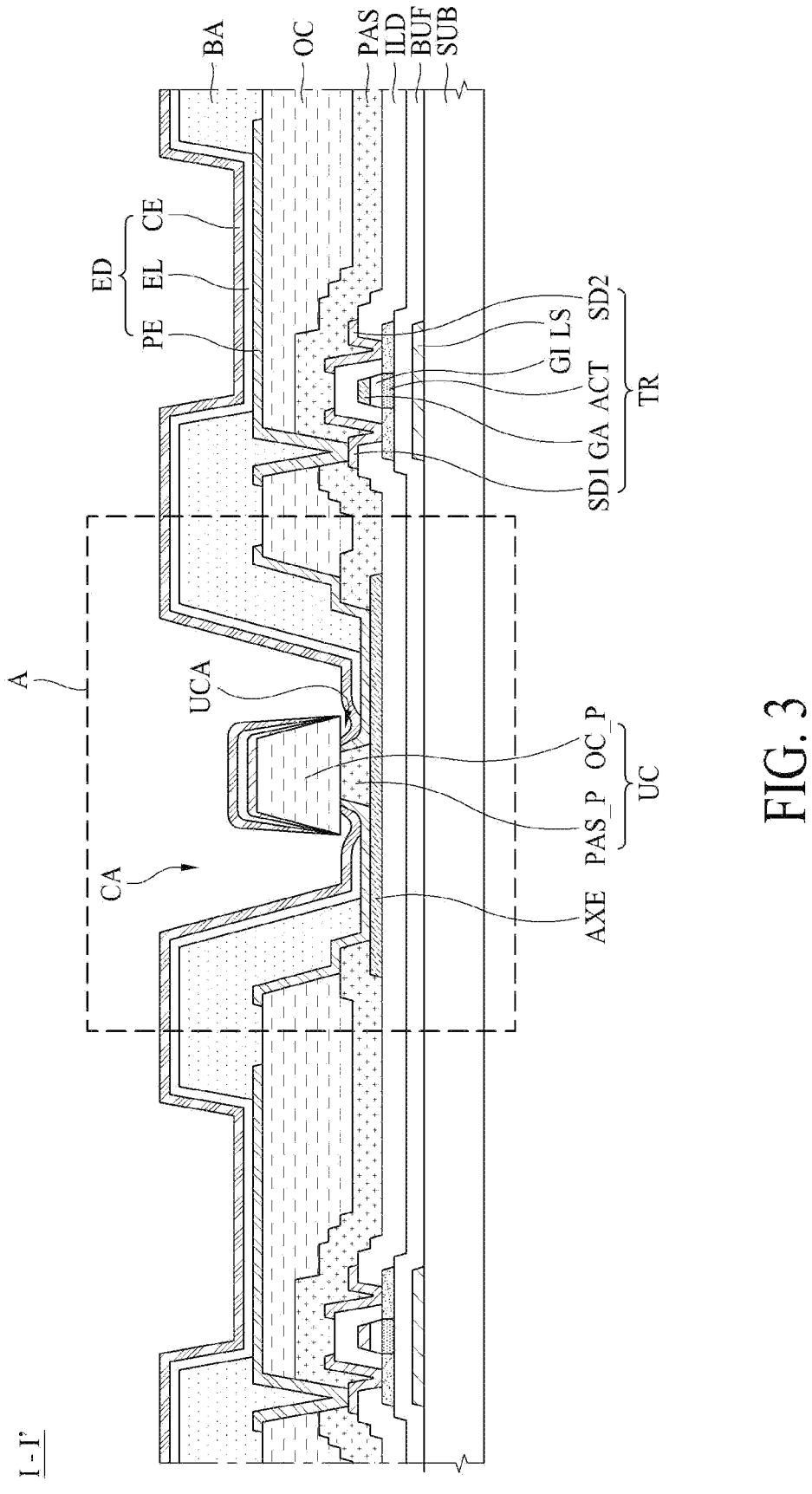
FIG. 3 is a diagram taken along line I-I' of FIG. 2 in a light emitting display device according to an embodiment of the present disclosure.

FIG. 3 is a diagram taken along line I-I' of FIG. 2 in a light emitting display device 100 according to an embodiment of the present disclosure.

Referring to FIG. 3, the light emitting display device 100 according to an embodiment of the present disclosure may include a substrate SUB, a light blocking layer LS, a buffer layer BUF, a thin film transistor (TFT) TR, a gate insulation layer GI, an interlayer insulation layer ILD, an auxiliary power electrode AXE, a passivation layer PAS (or a first protection layer), an overcoat layer OC (or a second protection layer), a light emitting device ED, a bank layer BA, and a contact portion CA.

The substrate SUB may be a base substrate and may include a glass or plastic material. For example, the substrate SUB may include a plastic material such as polyimide (PI), polyethylene terephthalate (PET), polyethylene naphthalate (PEN), or polycarbonate (PC) and may have a flexible characteristic, but embodiments of the present disclosure are not limited thereto.

A circuit element including various lines, the TFT TR, and a storage capacitor may be provided on the substrate SUB for each of a plurality of subpixels SP1 to SP4. For example, the lines may include a gate line GL, a data line DL, a first power line EVDD (a driving power line or a pixel power line), a second power line EVSS (an auxiliary power line or a common power line), and a reference line. For example, the TFT TR may include a driving TFT, a switching TFT, and a sensing TFT, but embodiments of the present disclosure are not limited thereto.

The light blocking layer LS may be disposed on the substrate SUB. The light blocking layer LS may be disposed at least partially, or wholly to overlap the TFT TR. The light blocking layer LS may overlap an active layer ACT of the TFT TR. For example, the light blocking layer LS may be disposed to at least partially, or wholly overlap a channel region of the active layer ACT, on a plane. The light blocking layer LS may prevent or at least reduce external light from penetrating into the active layer ACT. Alternatively, the various lines which are formed of the same material on the same layer as the light blocking layer LS may be disposed on the substrate SUB. In this case, the light blocking layer LS and the lines may be formed simultaneously through the same process, but embodiments of the present disclosure are not limited thereto.

The buffer layer BUF may be disposed on the substrate SUB to cover the light blocking layer LS. The buffer layer BUF may be formed by stacking a single layer or a plurality of inorganic layers. For example, the buffer layer BUF may be formed of a single layer including silicon oxide (SiOx), silicon nitride (SiNx), and silicon oxynitride (SiOxNy). Alternatively, the buffer layer BUF may be formed of a multilayer where at least two of SiOx, SiNx, and SiOxNy are stacked. The buffer layer BUF may be formed all over an upper surface of the substrate SUB so as to block ions or impurities diffused from the substrate SUB and prevent or at least reduce the penetration of water into the light emitting device ED.

The TFT TR and the storage capacitor may be disposed on the buffer layer BUF. The TFT TR may be disposed in each of the plurality of subpixels SP1 to SP4, on the buffer layer BUF. For example, the TFT TR may include the active layer ACT, a gate electrode GA overlapping the active layer ACT with the gate insulation layer GI therebetween, a first source/drain electrode SD1, and a second source/drain electrode SD2. Also, the storage capacitor may be formed in a triple structure where a first capacitor electrode which uses the light blocking layer LS or a portion or all of a line disposed on the same layer as the light blocking layer LS, a second capacitor electrode which is patterned by using the same material as that of the gate electrode GA of the TFT TR, and a third capacitor electrode, which is patterned by using the same material as the first and second source/drain electrodes SD1 and SD2 of the TFT TR, overlap one another. However, embodiments of the present disclosure are not limited thereto, and depending on the case, the storage capacitor may be implemented with a various plurality of layers. Alternatively, various lines may be disposed on the buffer layer BUF. For example, the various lines may include a gate line GL, a data line DL, a first power line EVDD (a driving power line or a pixel power line), a second power line EVSS (an auxiliary power line or a common power line), and a reference line, which include the same material as that of the gate electrode GA or the first and second source/drain electrodes SD1 and SD2, but embodiments of the present disclosure are not limited thereto.

The active layer ACT of the TFT TR may include a silicon-based or oxide-based semiconductor material and may be formed on the buffer layer BUF. The active layer ACT may include a channel region overlapping the gate electrode GA and a source/drain region connected with the first and second source/drain electrodes SD1 and SD2, but embodiments of the present disclosure are not limited thereto.

The gate insulation layer GI may be formed on the active layer ACT. The gate insulation layer GI may be disposed on the channel region of the active layer ACT and may insulate the active layer ACT from the gate electrode GA. The gate insulation layer GI may include an inorganic insulating material. For example, the gate insulation layer GI may include SiOx, SiNx, SiOxNy, or a multilayer thereof, but embodiments of the present disclosure are not limited thereto.

The gate electrode GA may be formed on the gate insulation layer GI. The gate electrode GA may be disposed to face the active layer ACT with the gate insulation layer GI therebetween. Also, the gate electrode GA may include a single layer or a multilayer including one material, selected from among the group comprising copper (Cu), molybdenum (Mo), aluminum (Al), chromium (Cr), gold (Au), titanium (Ti), nickel (Ni), neodymium (Nd), tantalum (Ta), and tungsten (W), or an alloy(s) thereof. Also, the second capacitor electrode configuring a portion of the storage capacitor may be formed of the same material as that of the gate electrode GA, on the buffer layer BUF. In this case, the gate electrode GA of the TFT TR and the second capacitor electrode of the storage capacitor may be formed simultaneously through the same process, but embodiments of the present disclosure are not limited thereto.

The interlayer insulation layer ILD covering the gate electrode GA may be formed on the buffer layer BUF. Also, the interlayer insulation layer ILD may be formed to cover the second capacitor electrode of the storage capacitor. The interlayer insulation layer ILD may protect the TFT TR. The interlayer insulation layer ILD may include an inorganic insulating material. For example, the interlayer insulation layer ILD may include SiOx, SiNx, SiOxNy, or a multilayer thereof, but embodiments of the present disclosure are not limited thereto.

The first and second source/drain electrodes SD1 and SD2 may be formed on the interlayer insulation layer ILD. A corresponding region of the interlayer insulation layer ILD may be removed for attaching the active layer ACT on the first and second source/drain electrodes SD1 and SD2. For example, the first and second source/drain electrodes SD1 and SD2 may contact the active layer ACT and may be electrically connected with the active layer ACT through a contact hole passing through the interlayer insulation layer ILD.

The first and second source/drain electrodes SD1 and SD2 may each be formed of a single layer or a multilayer. When each of the first and second source/drain electrodes SD1 and SD2 is formed of a single layer, each of the first and second source/drain electrodes SD1 and SD2 may include one material, selected from among the group comprising Cu, Mo, Al, Cr, Au, Ti, Ni, Nd, Ta, and W, or an alloy(s) thereof. Alternatively, when each of the first and second source/drain electrodes SD1 and SD2 is formed of a multilayer, each of the first and second source/drain electrodes SD1 and SD2 may be formed of a double layer of Mo/Al—Nd, Mo/Al, Ti/Al, or Cu/MoTi. Alternatively, each of the first and second source/drain electrodes SD1 and SD2 may be formed of a triple layer of Mo/Al-Nd/Mo, Mo/Al/Mo, Ti/Al/Ti, or MoTi/Cu/MoTi, but embodiments of the present disclosure are not limited thereto. According to another embodiment of the present disclosure, the first and second source/drain electrodes SD1 and SD2 may include the same material as that of the gate electrode GA, but embodiments of the present disclosure are not limited thereto.

The auxiliary power electrode AXE may be formed on the interlayer insulation layer ILD. According to an embodiment of the present disclosure, the auxiliary power electrode AXE may be provided as one body with an auxiliary power line EVSS (the common power line or a second power line). The auxiliary power electrode AXE may apply an auxiliary power (a low level voltage or a common voltage), supplied through the auxiliary power line EVSS, to a common electrode CE (a cathode electrode or a second electrode). Also, the auxiliary power electrode AXE may reduce a resistance of the common electrode CE along with the auxiliary power line EVSS. Also, the auxiliary power electrode AXE may function as the third capacitor electrode of the storage capacitor. The auxiliary power electrode AXE may include the same material as that of the gate electrode GA or the first and second source/drain electrodes SD1 and SD2. In this case, the auxiliary power electrode AXE may be formed simultaneously through the same process on the same layer as the gate electrode GA. Alternatively, the auxiliary power electrode AXE may be formed through the same process on the same layer as the first and second source/drain electrodes SD1 and SD2, but embodiments of the present disclosure are not limited thereto.

According to another embodiment of the present disclosure, the auxiliary power electrode AXE may be disposed on a layer which differs from the auxiliary power line EVSS. A corresponding region of at least one insulation layer between the auxiliary power electrode AXE and the auxiliary power line EVSS may be removed for allowing the auxiliary power electrode AXE to contact the auxiliary power line EVSS. For example, the auxiliary power electrode AXE may contact and may be electrically connected with the auxiliary power line EVSS through a contact hole passing through the at least one insulation layer, but embodiments of the present disclosure are not limited thereto.

The TFT TR, the storage capacitor, and the auxiliary power electrode AXE may configure a circuit layer (or a TFT array layer).

The passivation layer PAS (or the first protection layer) may be disposed on the interlayer insulation layer ILD including the TFT TR and the auxiliary power electrode AXE. The passivation layer PAS may protect the TFT TR and may include an inorganic insulating material. For example, the passivation layer PAS may include SiOx, SiNx, SiOxNy, or a multilayer thereof, but embodiments of the present disclosure are not limited thereto.

The overcoat layer OC (a second protection layer or a planarization layer) may be disposed on the passivation layer PAS (or the first protection layer). The overcoat layer OC may planarize a lower step height and may include an organic insulating material. For example, the overcoat layer OC may include at least one of organic materials such as photo acryl, polyimide, benzocyclobutene resin, and acrylate, but embodiments of the present disclosure are not limited thereto.

A pixel electrode PE (an anode electrode or a first electrode) may be disposed on the overcoat layer OC (the second protection layer or the planarization layer). The pixel electrode PE may be disposed in each of the plurality of subpixels SP1 to SP4 on the overcoat layer OC. The pixel electrode PE may be connected with the first source/drain electrode SD1 of the TFT TR through a contact hole passing through the overcoat layer OC and the passivation layer PAS. Alternatively, the pixel electrode PE may be connected with the second source/drain electrode SD2 of the TFT TR. An emission layer EL (or an organic emission layer) and a common electrode CE (a cathode electrode or a second electrode) may be disposed on the pixel electrode PE. The pixel electrode PE, the emission layer EL, and the common electrode CE may configure the light emitting device ED.

The pixel electrode PE (the anode electrode or the first electrode) may include metal, an alloy thereof, or a combination of metal and oxide metal. For example, the pixel electrode PE may be formed in a multi-layer structure including a transparent conductive layer and an opaque conductive layer which is high in reflection efficiency. The transparent conductive layer of the pixel electrode PE may include a material, having a relatively large work function value, such as indium tin oxide (ITO) or indium zinc oxide (IZO), and the opaque conductive layer may be formed of a single layer or a multilayer including one material, selected from among the group comprising silver (Ag), Al, Cu, Mo, Ti, Ni, Cr, and W, or an alloy thereof. For example, the pixel electrode PE may be formed in a structure where a transparent conductive layer, an opaque conductive layer, and a transparent conductive layer are sequentially stacked or may be formed in a structure where a transparent conductive layer and an opaque conductive layer are sequentially stacked, but embodiments of the present disclosure are not limited thereto.

The bank layer BA may be disposed on the pixel electrode PE and the overcoat layer OC. The bank layer BA may cover an edge portion of the pixel electrode PE and may define an opening portion of the subpixel SP. The bank layer BA may include an organic material such as polyimide, acrylate, or benzocyclobutene series resin, but embodiments of the present disclosure are not limited thereto. A center portion of the pixel electrode PE exposed by the bank layer BA may be defined as an emission region. Also, a portion covered by the bank layer BA may be defined as a non-emission region. Also, the bank layer BA may define a contact portion CA exposing a portion of the auxiliary power electrode AXE to electrically connect the auxiliary power electrode AXE with the common electrode CE.

The contact portion CA may pass through the passivation layer PAS, the overcoat layer OC, and the bank layer BA to expose a portion of the auxiliary power electrode AXE. An undercut structure UC including an undercut region UCA may be disposed on the auxiliary power electrode AXE exposed by the contact portion CA.

The undercut structure UC may be disposed on a portion of the auxiliary power electrode AXE and may include the undercut region UCA. The undercut structure UC may be provided in an island pattern on a portion of the auxiliary power electrode AXE, and the auxiliary power electrode AXE may be exposed at a peripheral perimeter of the undercut structure UC. The auxiliary power electrode AXE exposed at the peripheral perimeter of the undercut structure UC may contact and may be electrically connected with the common electrode CE (the cathode electrode or the second electrode), in the contact portion CA. The undercut structure UC may include the same material as that of each of the passivation layer PAS and the overcoat layer OC. The undercut structure UC may include a first pattern PAS_P including the same material as that of the passivation layer PAS and a second pattern OC_P including the same material as that of the overcoat layer OC. This enables the same patterning approach to be used in manufacturing. Different material could be used depending on the manufacturing process. Thus, the approach offers enhanced flexibility depending on the required manufacturing process, and offers a simpler approach, which can include a simplified patterning approach.

The emission layer EL may be disposed on the pixel electrode PE and the bank layer BA. Also, the emission layer EL may be disposed on the second pattern OC_P of the undercut structure UC. The emission layer EL may be disposed on the auxiliary power electrode AXE exposed through the contact portion CA. The emission layer EL may be disconnected in the undercut region UCA by the undercut structure UC disposed at the contact portion CA. For example, the emission layer EL may include a material which does not provide good in step coverage (i.e., a height to width of ratio of the filler, given generally a uniform step coverage is preferred). Accordingly, the emission layer EL may have an area which is disposed on the auxiliary power electrode AXE and is minimized or at least reduced by the undercut structure UC and enables advantageous disconnection in the undercut region UCA of the undercut structure UC.

The common electrode CE (the cathode electrode or the second electrode) may be disposed on the emission layer EL. The common electrode CE may be disposed on the emission layer EL on the second pattern OC_P of the undercut structure UC. The common electrode CE may be disposed on the pixel electrode PE and the emission layer EL to configure the light emitting device ED. The common electrode CE may be widely provided on an entire surface of the substrate SUB. The common electrode CE may include a transparent conductive material such as ITO or IZO, or may include Ag, Al, magnesium (Mg), calcium (Ca), or an alloy thereof having a thickness thin enough to allow transmission of light, but embodiments of the present disclosure are not limited thereto.

The common electrode CE may be disposed on and electrically connected with the auxiliary power electrode AXE exposed by the contact portion CA. The common electrode CE may be disposed to cover the bank layer BA and may be disposed on the auxiliary power electrode AXE in the undercut region UCA of the undercut structure UC. For example, the common electrode CE may include a material which is good in step coverage. The common electrode CE may be better in step coverage (for example, uniform height to width coverage) than the emission layer EL formed by an evaporation process, and thus, the emission layer EL may be disconnected in the undercut region UCA of the undercut structure UC and may be formed on the auxiliary power electrode AXE exposed at the outside. Therefore, the emission layer EL may not be disposed on the auxiliary power electrode AXE in the undercut region UCA of the undercut structure UC, but the common electrode CE may be disposed on the auxiliary power electrode AXE where the emission layer EL is not disposed and so advantageously can be electrically connected with the auxiliary power electrode AXE.

The light emitting display device 100 according to an embodiment of the present disclosure may further include a metal pattern in the contact portion CA. The metal pattern may be disposed at the contact portion CA and a periphery thereof. The metal pattern may directly contact and cover at least a portion of the auxiliary power electrode AXE and may be disposed between at least one protection layers PAS and OC and the bank layer BA. Also, the bank layer BA may be disposed to cover the at least one protection layers PAS and OC with the metal pattern therebetween, at a periphery of the contact portion CA. Hereinafter, a detailed configuration of the contact portion CA according to an embodiment of the present disclosure will be described with reference to FIGS. 4 to 6.

Figure 4:
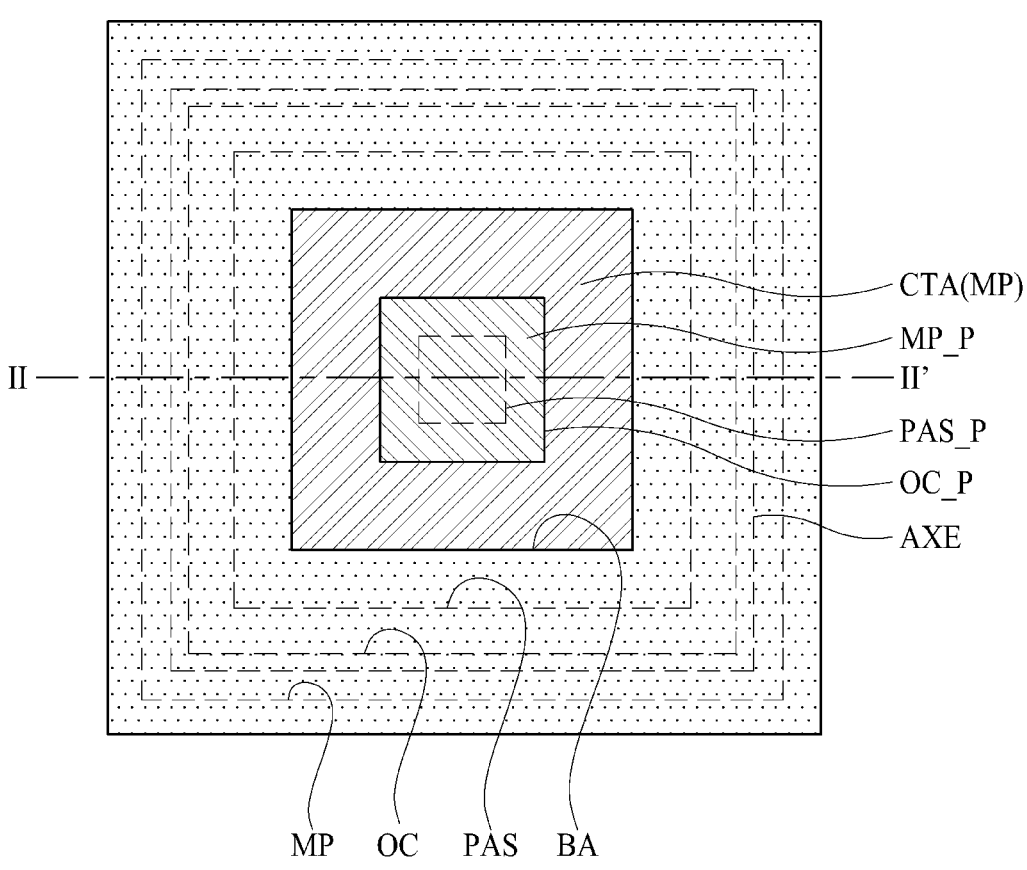
FIG. 4 is a plan view illustrating a contact portion illustrated in a region A of FIG. 3 according to an embodiment of the present disclosure.
Figure 5:
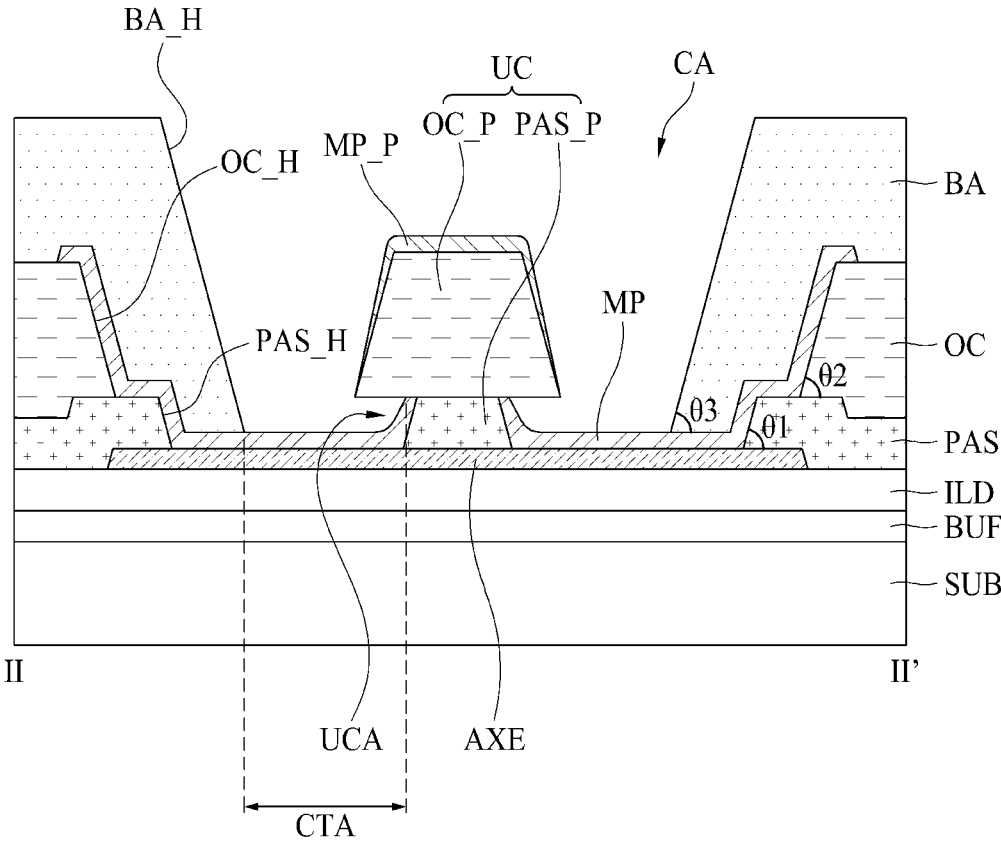
FIG. 5 is a cross-sectional view taken along line II-IT of FIG. 4 in a light emitting display device according to an embodiment of the present disclosure.

FIG. 4 is a plan view illustrating a contact portion illustrated in a region A of FIG. 3 according to an embodiment of the present disclosure. FIG. 5 is a cross-sectional view taken along line II-If of FIG. 4 in a light emitting display device 100 according to an embodiment of the present disclosure.

Referring to FIGS. 4 and 5 in conjunction with FIG. 3, the light emitting display device 100 according to an embodiment of the present disclosure may include a contact portion CA which exposes a portion of an auxiliary power electrode AXE. The contact portion CA may pass through a passivation layer PAS (or a first protection layer), an overcoat layer OC (or a second protection layer), and a bank layer BA to expose a portion of the auxiliary power electrode AXE, and thus, may provide a contact region CTA so as to be electrically connected with a common electrode CE.

The passivation layer PAS (or the first protection layer) may be disposed on an interlayer insulation layer ILD and may be formed to cover an edge of the auxiliary power electrode AXE on the interlayer insulation layer ILD. The passivation layer PAS may include a first opening portion PAS_H which exposes a portion of the auxiliary power electrode AXE. An undercut structure UC including an undercut region UCA may be disposed on an upper surface of the auxiliary power electrode AXE exposed by the first opening portion PAS_H of the passivation layer PAS. For example, the first opening portion PAS_H of the passivation layer PAS may be formed in a shape surrounding a periphery of the undercut structure UC with the undercut structure UC therebetween. The shape is chosen so that there is alignment with the undercut structure, to maximize or at least increase proper electrical connection via the auxiliary electrode, taking into account tolerances. That is, ideally, the passivation layer follows the shape of the undercut structure (congruently). The undercut structure UC may include a first pattern PAS_P and a second pattern OC_P, and the first pattern PAS_P of the undercut structure UC may include the same material as that of the passivation layer PAS.

The overcoat layer OC (or the second protection layer) may be disposed on the passivation layer PAS and may include a second opening portion OC_H which is greater than or equal to the first opening portion PAS_H of the passivation layer PAS. For example, the second opening portion OC_H of the overcoat layer OC may be formed in a shape corresponding to a perimeter of the first opening portion PAS_H of the passivation layer PAS and may have a size which is greater than that of the first opening portion PAS_H. A portion of the passivation layer PAS may be exposed through the second opening portion OC_H of the overcoat layer OC. For example, the second opening portion OC_H of the overcoat layer OC may be formed in a shape surrounding the periphery of the undercut structure UC with the undercut structure UC therebetween. The second pattern OC_P of the undercut structure UC may include the same material as that of the overcoat layer OC.

The first opening portion PAS_H of the passivation layer PAS and the second opening portion OC_H of the overcoat layer OC may be formed to each include a sloped surface. A slope angle θ1 between the slope surface of the first opening portion PAS_H and the auxiliary power electrode AXE or the interlayer insulation layer ILD may be equal to or different from a slope angle θ2 between the slope surface of the second opening portion OC_H and the auxiliary power electrode AXE or the passivation layer PAS. For example, the slope angle θ1 of the first opening portion PAS_H and the slope angle θ2 of the second opening portion OC_H may have substantially the same angle, except for a process deviation. The angles can advantageously be varied depending on the manufacturing process. Different materials or undercut and passivation layers, can have different etching rates, so there is forming in different shapes to account of different etching rates when patterning. The etching time can be flexed for different slopes, depending on design requirements or "rules".

The undercut structure UC may be disposed on the auxiliary power electrode AXE exposed through the first opening portion PAS_H of the passivation layer PAS and the second opening portion OC_H of the overcoat layer OC. The undercut structure UC may be disposed inward from the first opening portion PAS_H and the second opening portion OC_H.

The undercut structure UC may be disposed on a portion of the auxiliary power electrode AXE and may include an undercut region UCA. For example, the undercut structure UC may be disposed on a portion of the auxiliary power electrode AXE exposed through the first opening portion PAS_H of the passivation layer PAS and the second opening portion OC_H of the overcoat layer OC. The undercut structure UC may be formed to have an island pattern at a center portion of the auxiliary power electrode AXE exposed through the first opening portion PAS_H and the second opening portion OC_H. This island, or generally "mushroom" shape can be seen in the figures, for example Figure (refer to FIGS. 3, 5-6, 8-14). The undercut region UCA of the undercut structure UC may configure an exposure region of the auxiliary power electrode AXE where an emission layer EL is not disposed. A common electrode CE may be disposed in and electrically connected with the exposure region of the auxiliary power electrode AXE.

The undercut structure UC may include a first pattern PAS_P and a second pattern OC_P. The first pattern PAS_P and the second pattern OC_P of the undercut structure UC may include an inorganic insulating material or an organic insulating material. For example, the first pattern PAS_P of the undercut structure UC may include the same material as that of the passivation layer PAS. The second pattern OC_P of the undercut structure UC may include the same material as that of the overcoat layer OC.

The first pattern PAS_P may be formed on an upper surface of the auxiliary power electrode AXE. The first pattern PAS_P may be formed with an island pattern and may include an upper surface which has a first width and contacts the second pattern OC_P, a lower surface which has a second width greater than the first width and contacts the auxiliary power electrode AXE, and a slope surface between the upper surface and the lower surface. For example, a slope surface of the first pattern PAS_P may be arranged at the same slope angle θ1 as that of a slope surface of the first opening portion PAS_H of the passivation layer PAS. For example, the first pattern PAS_P may be formed of the same material on the same layer as the passivation layer PAS. The first pattern PAS_P may be formed together through the same process as the first opening portion PAS_H of the passivation layer PAS.

The second pattern OC_P may be formed on an upper surface of the first pattern PAS_P. The second pattern OC_P may be supported by the first pattern PAS_P. The second pattern OC_P may be formed on the first pattern PAS_P to have an island pattern and may be formed in a shape which protrudes from the first pattern PAS_P. The undercut region UCA may be formed under an edge of the second pattern OC_P protruding from a lateral surface of the first pattern PAS_P. The second pattern OC_P may have a width which is greater than the first and second widths of the first pattern PAS_P and may include a lower surface which contacts the first pattern PAS_P, an upper surface which is less in width than the lower surface, and a slope surface between the upper surface and the lower surface. For example, a sloped surface of the second pattern OC_P may be arranged at the same slope angle $\theta 2$ as that of a sloped surface of the second opening portion OC_H of the overcoat layer OC. For example, the second pattern OC_P may be formed of the same material on the same layer as the overcoat layer OC. The second pattern OC_P may be formed together through the same process as the second opening portion OC_H of the overcoat layer OC.

The light emitting display device 100 according to an embodiment of the present disclosure may further include a contact portion CA and a metal pattern MP which is disposed on the overcoat layer OC and the passivation layer PAS at a periphery of the contact portion CA. For example, the metal pattern MP may be disposed on the first opening portion PAS_H of the passivation layer PAS and the second opening portion OC_H of the overcoat layer OC. The metal pattern MP may be disposed on the auxiliary power electrode AXE exposed through the first opening portion PAS_H and the second opening portion OC_H. The metal pattern MP may be disposed on the undercut structure UC.

The metal pattern MP may include a metal electrode material. The metal pattern MP may be formed to cover the first opening portion PAS_H of the passivation layer PAS, the second opening portion OC_H of the overcoat layer OC, and the auxiliary power electrode AXE exposed through the first opening portion PAS_H and the second opening portion OC_H. For example, the metal pattern MP may be formed to cover the second opening portion OC_H of the overcoat layer OC, the first opening portion PAS_H of the passivation layer PAS, and the auxiliary power electrode AXE from an upper surface of the overcoat layer OC adjacent to the second opening portion OC_H of the overcoat layer OC. Also, the metal pattern MP may be formed to cover a lateral surface of the first pattern PAS_P under the second pattern OC_P of the undercut structure UC. The metal pattern MP may include the same material as that of at least a portion of a pixel electrode PE disposed in a subpixel SP. The metal pattern MP may be formed of the same material through the same process as the pixel electrode PE. For example, in a case where the metal pattern MP is formed in a structure where the pixel electrode PE includes a plurality of layers stacked, the metal pattern MP may include the same material as that of at least a portion of a multi-layer stack structure. The metal pattern MP may be disposed apart from the pixel electrode PE provided in the subpixel SP. The metal pattern MP may be disposed apart from the pixel electrode PE, on the overcoat layer OC. For example, the metal pattern MP may be disposed at a portion of an upper surface of the overcoat layer OC apart from the pixel electrode PE. The metal pattern MP may be disposed apart from the pixel electrode PE on the upper surface of the overcoat layer OC adjacent to the second opening portion OC_H of the overcoat layer OC.

The metal pattern MP according to an embodiment of the present disclosure may directly contact the auxiliary power electrode AXE to function as an electrical path for the auxiliary power electrode AXE and may be formed to cover a lateral surface of the first pattern PAS_P of the undercut region UCA, and thus, may increase an area of a contact portion CA electrically connected with the common electrode CE. This advantageous improves electrical contact.

A metal cover pattern MP_P including the same material as that of the metal pattern MP may be disposed on an upper surface of the undercut structure UC. The metal pattern MP and the metal cover pattern MP_P may be formed of the same material through the same process. The metal cover pattern MP_P may be formed to cover an upper surface of the second pattern OC_P of the undercut structure UC. The metal cover pattern MP_P according to an embodiment of the present disclosure may be formed to cover the second pattern OC_P including an organic insulating material, and thus, a protruding portion (or an eaves portion) of the second pattern OC_P may minimize or at least reduce a change in shape like partial detachment or sagging, and thus, the structural stability of the undercut structure UC may be enhanced.

In the light emitting display device 100 according to an embodiment of the present disclosure, a bank layer BA may be disposed on the overcoat layer OC and the passivation layer PAS at a periphery of the contact portion CA. The metal pattern MP may be disposed between the bank layer BA and the passivation layer PAS. Also, the metal pattern MP may be disposed between the bank layer BA and the overcoat layer OC. For example, the bank layer BA may be disposed on the first opening portion PAS_H of the passivation layer PAS and the second opening portion OC_H of the overcoat layer OC with the metal pattern MP therebetween.

The bank layer BA may be disposed on the overcoat layer OC and the passivation layer PAS and may include a third opening portion BA_H which exposes a portion of the metal pattern MP contacting the auxiliary power electrode AXE. The third opening portion BA_H of the bank layer BA may have a size which is less than that of each of the first opening portion PAS_H of the passivation layer PAS and the second opening portion OC_H of the overcoat layer OC. For example, the bank layer BA may cover the first opening portion PAS_H of the passivation layer PAS and the second opening portion OC_H of the overcoat layer OC and may expose a portion of the metal pattern MP contacting the auxiliary power electrode AXE through the third opening portion BA_H of the bank layer BA. The third opening portion BA_H of the bank layer BA may define a region of the contact portion CA. The third opening portion BA_H of the bank layer BA may provide a contact region CTA which exposes a portion of the metal pattern MP contacting the auxiliary power electrode AXE so as to be electrically connected with a common electrode CE. For example, the third opening portion BA_H of the bank layer BA may be formed in a shape surrounding a periphery of the undercut structure UC with the undercut structure UC therebetween.

The third opening portion BA_H of the bank layer BA may be formed to include a slope surface. A slope angle $\theta 3$ between the slope surface of the third opening portion BA_H and the auxiliary power electrode AXE may be equal to or different from a slope angle $\theta 1$ of the first opening portion PAS_H or a slope angle $\theta 2$ of the second opening portion OC_H. For example, the slope angle $\theta 3$ of the third opening portion BA_H may be substantially the same the slope surface $\theta 1$ of the first opening portion PAS_H or the slope angle $\theta 2$ of the second opening portion OC_H, except for a process deviation. The angles can be advantageously varied depending on process and material in use.

According to an embodiment of the present disclosure, the bank layer BA can avoid direct contact with the passivation layer PAS which can potentially reducing adhesive force, by using the metal pattern MP. Accordingly, a size of the third opening portion BA_H of the bank layer BA can be reduced, allowing for an improvement in an aperture ratio of a pixel.

An emission layer EL may be disposed on the contact portion CA of the light emitting display device 100 according to an embodiment of the present disclosure. Also, the common electrode CE may be disposed on the emission layer EL.

As illustrated in FIG. 3, the emission layer EL may be formed on the pixel electrode PE, the bank layer BA, and the contact portion CA of the subpixel SP. Also, the common electrode CE may be formed on the emission layer EL on the pixel electrode PE, the bank layer BA, and the contact portion CA.

The emission layer EL may be formed on the undercut structure UC and may be partially formed on the metal pattern MP contacting the auxiliary power electrode AXE along the third opening portion BA_H of the bank layer BA at a periphery of the undercut structure UC. The emission layer EL may not be disposed on the metal pattern MP corresponding to the undercut region UCA formed by the undercut structure UC. The emission layer EL may not provide good in step coverage, and thus, may be formed up to only a portion except the undercut region UCA and may be disconnected without being formed on the metal pattern MP corresponding to the undercut region UCA. Therefore, the emission layer EL may be disconnected in the undercut region UCA by the undercut structure UC, and thus, usefully providing a contact region which exposes an upper surface of the metal pattern MP corresponding to the undercut region UCA and advantageously allows the common electrode CE to directly contact the metal pattern MP. Accordingly, the common electrode CE may be electrically connected with the auxiliary power electrode AXE through the metal pattern MP.

The common electrode CE may be formed on the emission layer EL. The common electrode CE may be provided on the emission layer EL on the undercut structure UC and may be formed on the emission layer EL provided along the third opening portion BA_H of the bank layer BA at a periphery of the undercut structure UC. The common electrode CE may be provided on the metal pattern MP exposed by the emission layer EL in the undercut region UCA provided by the undercut structure UC. The common electrode CE may directly contact the metal pattern MP and may be electrically connected with the auxiliary power electrode AXE through the metal pattern MP. The common electrode CE may include a material which is better in step coverage than the emission layer EL, and thus, may be formed up to the metal pattern MP of the undercut region UCA where the emission layer EL is not provided. Also, the common electrode CE may be formed on the metal pattern MP provided to cover a lateral surface of the first pattern PAS_P of the undercut structure UC in the undercut region UCA. According to an embodiment of the present disclosure, the common electrode CE may be provided to extend up to the lateral surface of the first pattern PAS_P of the undercut region UCA, and thus, a contact area of the metal pattern MP may increase.

Figure 6:
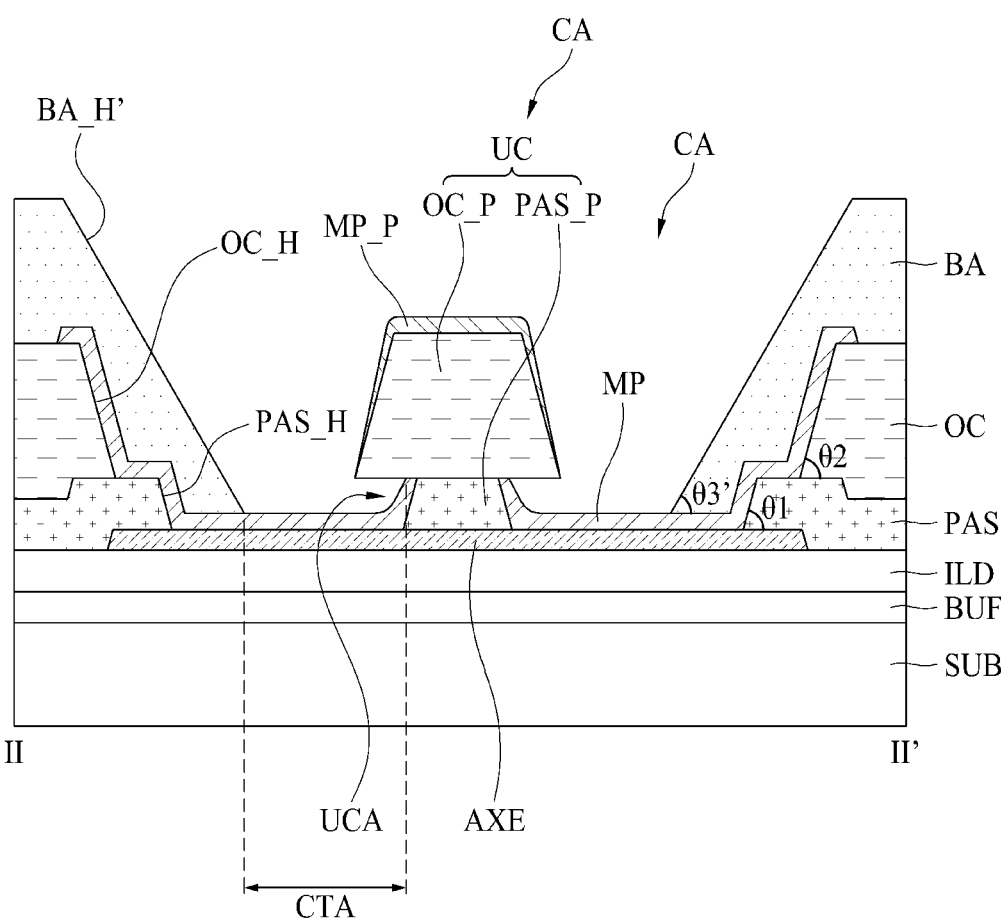
FIG. 6 is a cross-sectional view taken along line II-IT of FIG. 4 in a light emitting display device according to another embodiment of the present disclosure.

FIG. 6 is a cross-sectional view taken along line II-If of FIG. 4 in a light emitting display device according to another embodiment of the present disclosure. FIG. 6 illustrates an embodiment implemented by modifying a configuration of a third opening portion BA_H' of a bank layer BA in the light emitting display device 100 described above with reference to FIGS. 3 to 5. Hereinafter, therefore, repeated descriptions of the other elements except for a configuration of a third opening portion BA_H' of a bank layer BA and relevant elements are omitted or will be briefly given.

Referring to FIG. 6, a bank layer BA according to another embodiment of the present disclosure may be disposed on an overcoat layer OC and a passivation layer PAS and may include a third opening portion BA_H' which exposes a portion of a metal pattern MP contacting an auxiliary power electrode AXE.

The bank layer BA may cover a first opening portion PAS_H of the passivation layer PAS and a second opening portion OC_H of the overcoat layer OC and may expose a portion of the metal pattern MP contacting the auxiliary power electrode AXE through the third opening portion BA_H' of the bank layer BA. The third opening portion BA_H' of the bank layer BA may define a region of a contact portion CA. The third opening portion BA_H' of the bank layer BA may provide a contact region CTA which exposes a portion of the metal pattern MP contacting the auxiliary power electrode AXE so as to be electrically connected with the common electrode CE. For example, the third opening portion BA_H' of the bank layer BA may be provided in a shape surrounding a periphery of the undercut structure UC with the undercut structure material therebetween.

The third opening portion BA_H' of the bank layer BA may be formed to include a slope surface. A slope angle $\theta3'$ between the slope surface of the third opening portion BA_H' and the auxiliary power electrode AXE may differ from a slope angle $\theta1$ of the first opening portion PAS_H or a slope angle $\theta2$ of the second opening portion OC_H. For example, the slope angle $\theta3'$ of the third opening portion BA_H' may be less than the slope angle $\theta1$ of the first opening portion PAS_H or the slope angle $\theta2$ of the second opening portion OC_H.

The third opening portion BA_H' of the bank layer BA may be formed to include a slope surface having the slope angle $\theta3'$ which is less than that of a slope surface of each of the first opening portion PAS_H of the passivation layer PAS and the second opening portion OC_H of the overcoat layer OC. Therefore, a partial region of the third opening portion BA_H' of the bank layer BA may have a size which is less than that of each of the first opening portion PAS_H of the passivation layer PAS and the second opening portion OC_H of the overcoat layer OC. Also, another region of the third opening portion BA_H' of the bank layer BA may have a size which is greater than that of each of the first opening portion PAS_H of the passivation layer PAS and the second opening portion OC_H of the overcoat layer OC. For example, when the third opening portion BA_H' of the bank layer BA is a portion overlapping the first opening portion PAS_H and the second opening portion OC_H, the third opening portion BA_H' of the bank layer BA may have a size which is less than the first opening portion PAS_H and the second opening portion OC_H. Also, when the third opening portion BA_H' of the bank layer BA is a portion which does not overlap the first opening portion PAS_H and the second opening portion OC_H, the third opening portion BA_H' of the bank layer BA may have a size which is greater than the first opening portion PAS_H and the second opening portion OC_H.

According to another embodiment of the present disclosure, the slope angle $\theta3'$ of the third opening portion BA_H' of the bank layer BA may be set to be relatively low, and thus, a coverage characteristic of a material which is to be deposited in a subsequent process may be enhanced. For example, as the slope angle $\theta3'$ of the third opening portion BA_H' is set to be relatively low, the common electrode CE may be formed by smoothly penetrating into the undercut region UCA in a deposition process performed on the common electrode CE. Accordingly, a contact area and a thickness of the common electrode CE and the auxiliary power electrode AXE in the undercut region UCA may be increased.

Hereinafter, a method of manufacturing a light emitting display device according to an embodiment of the present disclosure will be described in more detail with reference to FIGS. 7 to 14.

FIGS. 7 to 14 are manufacturing process diagrams for describing a method of manufacturing a light emitting display device according to an embodiment of the present disclosure.

Figure 7:
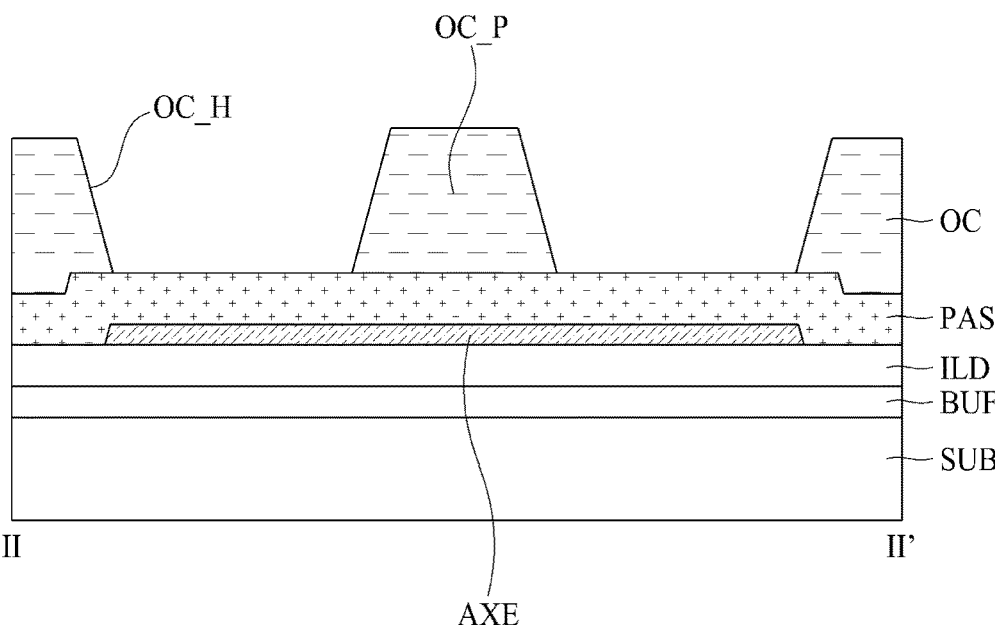
FIGS. 7 to 14 are manufacturing process diagrams for describing a method of manufacturing a light emitting display device according to an embodiment of the present disclosure.

Referring to FIG. 7, a circuit layer configured with a buffer layer BUF, an interlayer insulation layer ILD, and an auxiliary power electrode AXE may be formed on a substrate SUB, and a passivation layer PAS may be formed on the circuit layer. An overcoat layer OC may be formed on the passivation layer PAS.

The overcoat layer OC may be patterned to expose a portion of the passivation layer PAS overlapping the auxiliary power electrode AXE. The overcoat layer OC may be patterned to include a second opening portion OC_H which exposes a portion of the passivation layer PAS, and a second pattern OC_P configuring an undercut structure UC may be patterned at a center of an exposure region of the passivation layer PAS.

The second pattern OC_P may be formed to have an island pattern at the center of the exposure region of the passivation layer PAS. The passivation layer PAS may be exposed between the second pattern OC_P and the second opening portion OC_H. Through a subsequent process, the passivation layer PAS between the second pattern OC_P and the second opening portion OC_H may be removed, and a portion of the auxiliary power electrode AXE may be exposed through a portion from which the passivation layer PAS is removed.

Figure 8:
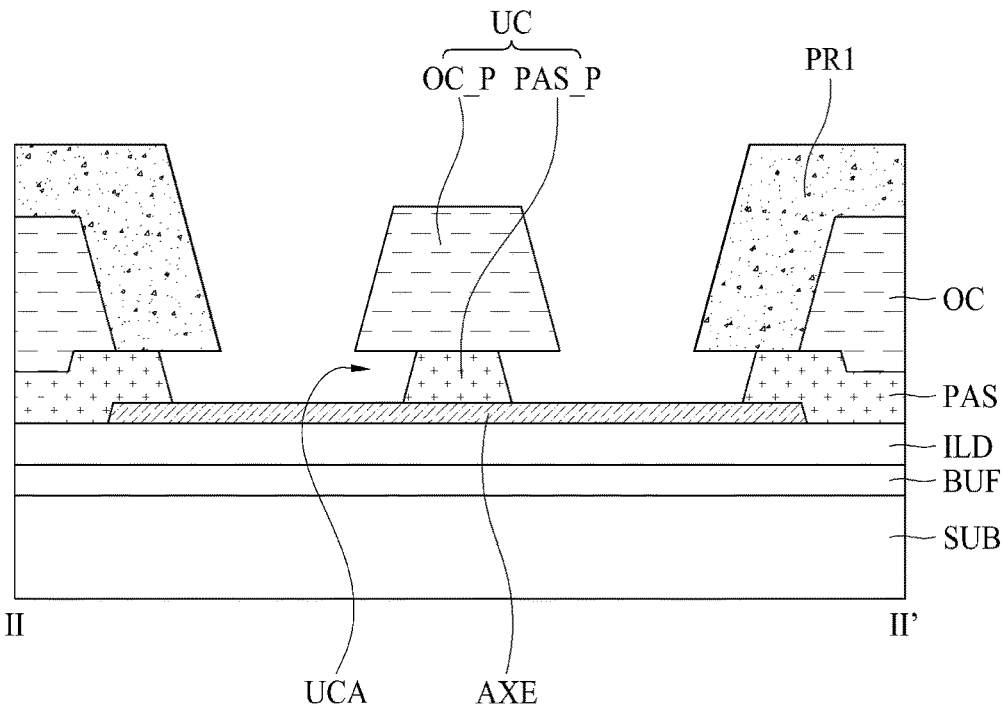

Referring to FIG. 8, as the overcoat layer OC is patterned, the second pattern OC_P and the second opening portion OC_H may be patterned, and then, a first photoresist PR1 may be formed on an upper surface of the overcoat layer OC.

The first photoresist PR1 may be patterned to cover the second opening portion OC_H and an upper surface of the overcoat layer OC at a periphery of the second pattern OC_P. The first photoresist PR1 may not be disposed on the second pattern OC_P. The first photoresist PR1 may be formed to expose the passivation layer PAS at a periphery of the second pattern OC_P. The second pattern OC_P may function as a mask pattern of the passivation layer PAS along with the first photoresist PR1. A portion of the passivation layer PAS may be removed by performing a wet etching process which uses the second pattern OC_P and the first photoresist PR1 as a mask pattern.

The passivation layer PAS may be patterned to include a first opening portion PAS_H having a size which is less than that of the second opening portion OC_H of the overcoat layer OC, based on a wet etching process, and the first pattern PAS_P configuring the undercut structure UC may be patterned under the second pattern OC_P. The first opening portion PAS_H of the passivation layer PAS may be formed by additionally removing a portion of the passivation layer PAS disposed under an edge of the first photoresist PR1. For example, the first opening portion PAS_H may be formed by additionally removing the passivation layer PAS, disposed under the edge of the first photoresist PR1, in a direction toward an inner portion instead of an end of the first photoresist PR1. Also, the first pattern PAS_P of the passivation layer PAS may be formed by additionally removing a portion of the passivation layer PAS disposed under an edge of the second pattern OC_P. For example, the first pattern PAS_P may be formed by additionally removing the passivation layer PAS, disposed under the edge of the second pattern OC_P, in a direction toward an inner portion from an end of the second pattern OC_P. The first pattern PAS_P may be formed more inward than the edge of the second pattern OC_P, and thus, an undercut region UCA may be formed.

Figure 9:
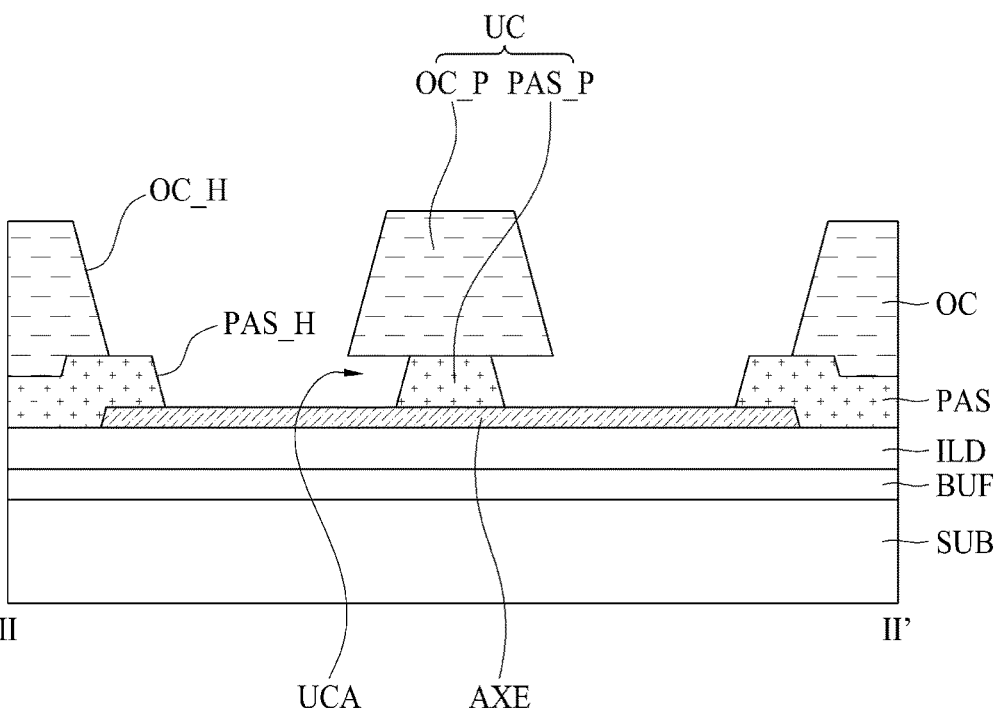

Referring to FIG. 9, after a wet etching process on the passivation layer PAS is completed, when the first photoresist PR1 is removed, the first opening portion PAS_H may be formed in the passivation layer PAS, and the second opening portion OC_H having a size which is greater than the first opening portion PAS_H may be formed in the overcoat layer OC. A portion of the passivation layer PAS may be exposed through the second opening portion OC_H of the overcoat layer OC. Also, the undercut structure UC including the first pattern PAS_P including the same material as that of the passivation layer PAS and the second pattern OC_P including the same material as that of the overcoat layer OC may be formed on the auxiliary power electrode AXE exposed through the first opening portion PAS_H of the passivation layer PAS and the second opening portion OC_H of the overcoat layer OC. The undercut structure UC may be disposed inward from the first opening portion PAS_H and the second opening portion OC_H.

Figure 10:
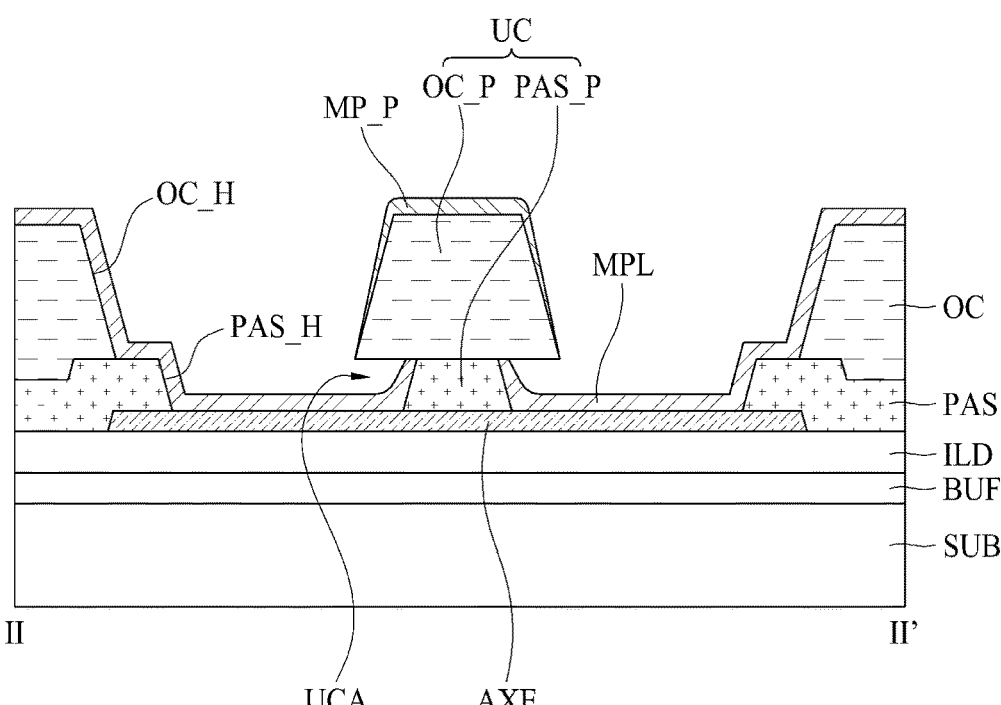

Referring to FIG. 10, after the first opening portion PAS_H of the passivation layer PAS, the second opening portion OC_H of the overcoat layer OC, and the undercut structure UC are formed, a metal layer MPL may be formed.

The metal layer MPL may include a metal electrode material. The metal layer MPL may include the same material as that of at least a portion of the pixel electrode PE. For example, the metal layer MPL may be formed of the same material through the same process as the pixel electrode PE. For example, in a case where the metal layer MPL is formed in a structure where the pixel electrode PE includes a plurality of layers stacked, the metal layer MPL may include the same material as that of at least a portion of a multi-layer stack structure.

The metal layer MPL may be formed to cover the passivation layer PAS, the overcoat layer OC, and the auxiliary power electrode AXE exposed through the first opening portion PAS_H of the passivation layer PAS and the second opening portion OC_H of the overcoat layer OC. Also, the metal layer MPL may be formed to cover a lateral surface of the first pattern PAS_P under the second pattern OC_P of the undercut structure UC. Also, a portion of the metal layer MPL may be formed as a metal cover pattern MP_P on the undercut structure UC.

Figure 11:
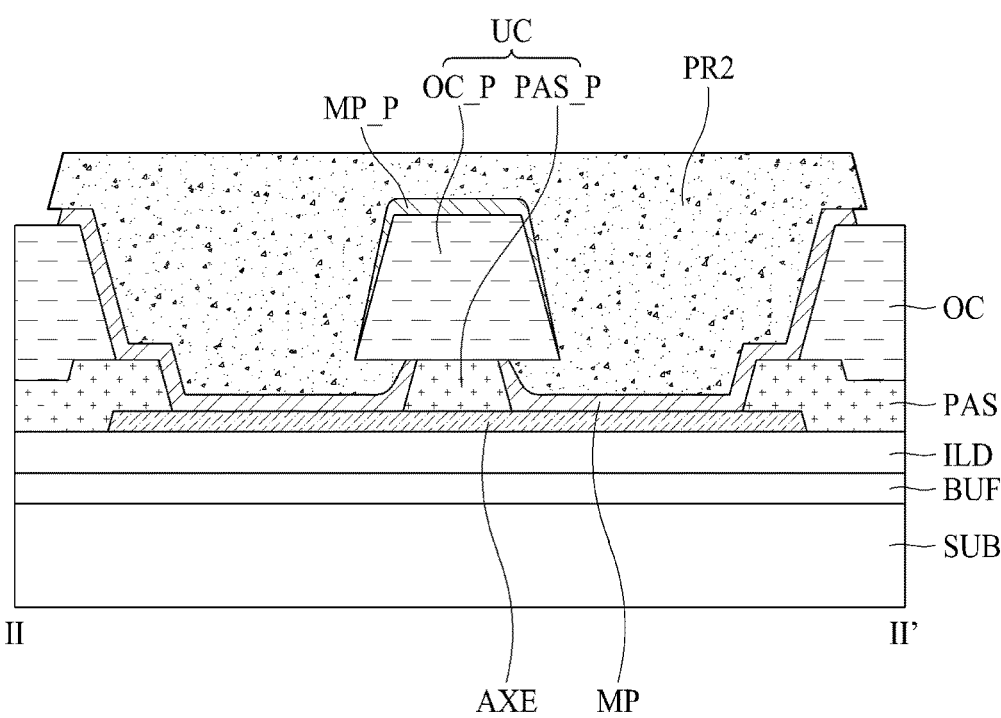

Referring to FIG. 11, a second photoresist PR2 may be formed on an upper surface of the metal layer MPL.

The second photoresist PR2 may be patterned to cover a portion of an upper surface of the metal layer MPL. The second photoresist PR2 may function as a mask pattern which allows only a portion of the metal layer MPL to remain. A metal pattern MP may be formed by performing a wet etching process which uses the second photoresist PR2 as the mask pattern.

In the metal layer MPL, the metal pattern MP for covering the first opening portion PAS_H of the passivation layer PAS, the second opening portion OC_H of the overcoat layer OC, and the auxiliary power electrode AXE exposed through the first opening portion PAS_H and the second opening portion OC_H may be patterned. The metal pattern MP may be formed apart from the pixel electrode PE, on the overcoat layer OC.

Figure 12:
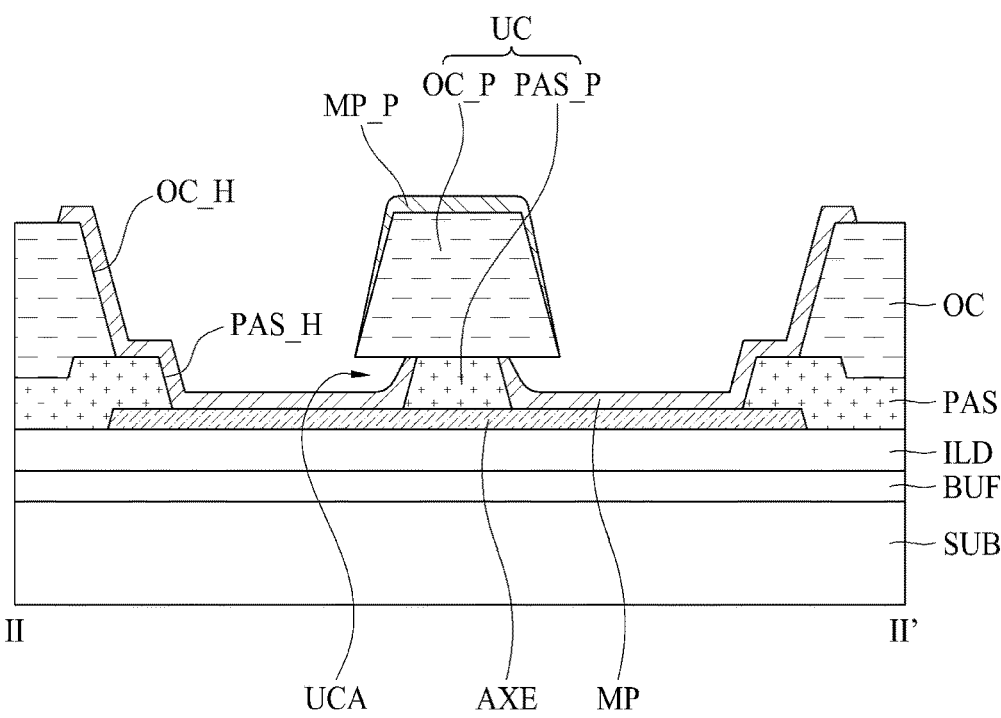

Referring to FIG. 12, after a wet etching process on the metal layer MPL is completed, when the second photoresist PR2 is removed, the metal pattern MP may be formed to cover the first opening portion PAS_H of the passivation layer PAS, the second opening portion OC_H of the overcoat layer OC, and the auxiliary power electrode AXE exposed through the first opening portion PAS_H and the second opening portion OC_H. For example, the metal pattern MP may be formed to cover the second opening portion OC_H of the overcoat layer OC, the first opening portion PAS_H of the passivation layer PAS, and the auxiliary power electrode AXE. Also, the metal pattern MP may be formed to cover a lateral surface of the first pattern PAS_P under the second pattern OC_P of the undercut structure UC. Also, a metal cover pattern MP_P may be formed on an upper surface of the second pattern OC_P of the undercut structure UC.

Figure 13:
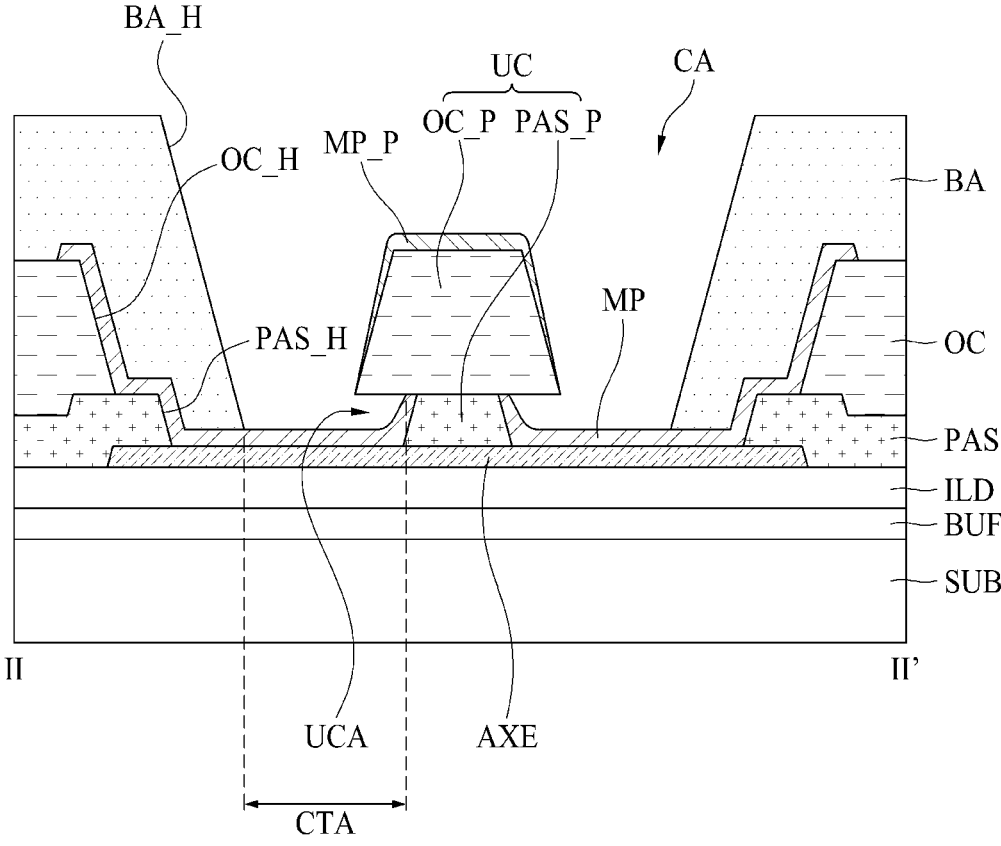

Referring to FIG. 13, after the metal pattern MP and the metal cover pattern MP_P are formed, a bank layer BA may be formed.

The bank layer BA may be disposed on the overcoat layer OC and the passivation layer PAS and may be formed to include a third opening portion BA_H which exposes a portion of the metal pattern MP contacting the auxiliary power electrode AXE. The third opening portion BA_H of the bank layer BA may be formed to have a size which is less than that of the first opening portion PAS_H of the passivation layer PAS and the second opening portion OC_H of the overcoat layer OC. For example, the bank layer BA may cover the first opening portion PAS_H of the passivation layer PAS and the second opening portion OC_H of the overcoat layer OC and may expose a portion of the metal pattern MP contacting the auxiliary power electrode AXE through the third opening portion BA_H of the bank layer BA. The third opening portion BA_H of the bank layer BA may define a region of the contact portion CA. The third opening portion BA_H of the bank layer BA may provide a contact region CTA which exposes a portion of the metal pattern MP contacting the auxiliary power electrode AXE so as to be electrically connected with a common electrode CE.

Figure 14:
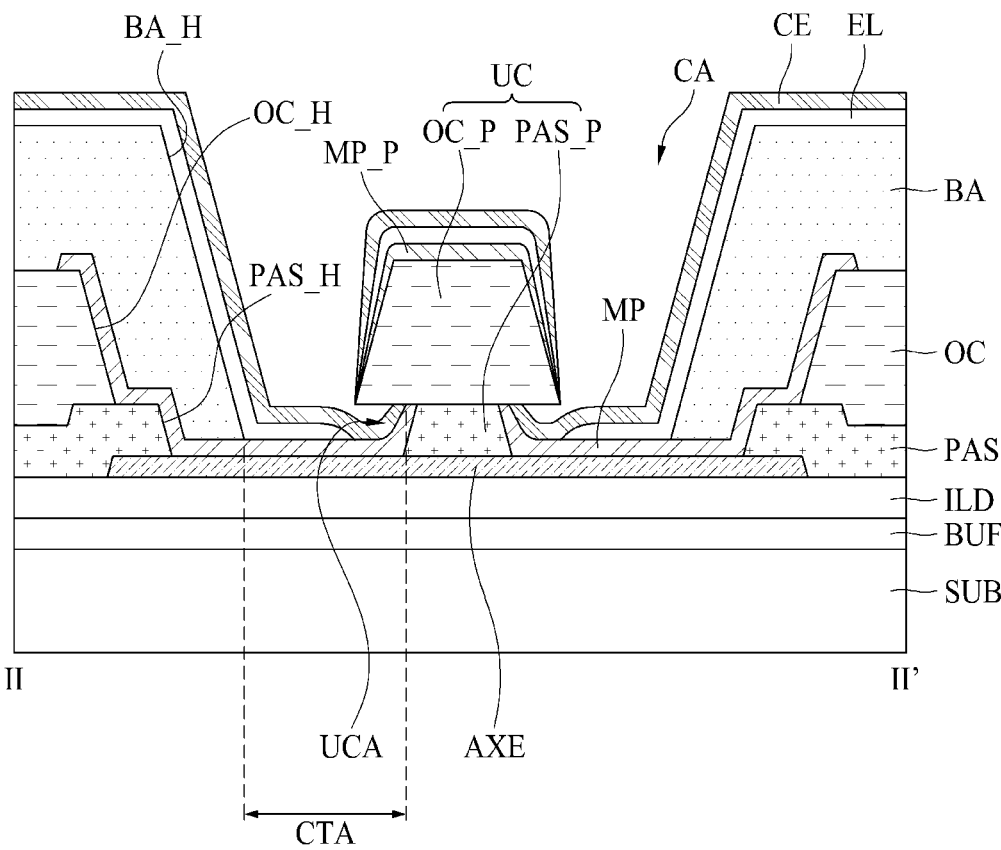

Referring to FIG. 14, after the bank layer BA is formed, an emission layer EL and a common electrode CE may be formed.

The emission layer EL may be formed on the undercut structure UC and may be partially formed on the metal pattern MP contacting the auxiliary power electrode AXE along the third opening portion BA_H of the bank layer BA at a periphery of the undercut structure UC. it is thus possible for the emission layer EL not to be disposed on the metal pattern MP corresponding to the undercut region UCA formed by the undercut structure UC, which is advantageous.

The common electrode CE may be formed on the emission layer EL. The common electrode CE may be provided on the emission layer EL on the undercut structure UC and may be formed on the emission layer EL provided along the third opening portion BA_H of the bank layer BA at a periphery of the undercut structure UC. The common electrode CE may be provided on the metal pattern MP exposed by the emission layer EL in the undercut region UCA provided by the undercut structure UC. The common electrode CE may directly contact the metal pattern MP and may be electrically connected with the auxiliary power electrode AXE through the metal pattern MP. Also, the common electrode CE may be formed on the metal pattern MP provided to cover a lateral surface of the first pattern PAS_P of the undercut structure UC in the undercut region UCA.

The light emitting display device according to the embodiment of the present disclosure may be described as follows.

The light emitting display device according to an embodiment of the present disclosure may include a substrate, a circuit layer including an auxiliary power electrode disposed on the substrate, at least one protection layer covering the circuit layer, a contact portion passing through the at least one protection layer to expose a portion of the auxiliary power electrode, and a metal pattern disposed on the contact portion and the at least one protection layer at a periphery of the contact portion.

In the light emitting display device according to an embodiment of the present disclosure, the metal pattern may directly contact at least a portion of the auxiliary power electrode.

In the light emitting display device according to an embodiment of the present disclosure, may further include a bank layer on the at least one protection layer at the periphery of the contact portion, the metal pattern may be between the at least one protection layer and the bank layer.

In the light emitting display device according to an embodiment of the present disclosure, the bank layer may include a material which differs from a material of the at least one protection layer.

In the light emitting display device according to an embodiment of the present disclosure, the at least one protection layer and the bank layer may each include a slope surface, at the periphery of the contact portion.

In the light emitting display device according to an embodiment of the present disclosure, a slope angle between the slope surface of the bank layer and the auxiliary power electrode may be less than or equal to a slope angle between the slope surface of the at least one protection layer and the auxiliary power electrode.

In the light emitting display device according to an embodiment of the present disclosure, may further include an undercut structure disposed on a portion of the auxiliary power electrode at the contact portion, the undercut structure including an undercut region, the undercut structure comprising a same material as a material of the at least one protection layer.

In the light emitting display device according to an embodiment of the present disclosure, the undercut region may be formed all over an edge of the undercut structure.

In the light emitting display device according to an embodiment of the present disclosure, the undercut structure may be comprised in a cathode contact structure, and may include a passivation layer and an overcoat layer.

In the light emitting display device according to an embodiment of the present disclosure, the at least one protection layer may include a first protection layer disposed on the auxiliary power electrode, the first protection layer including an inorganic insulating material, and a second protection layer disposed on the first protection layer, the second protection layer including an organic insulating material.

In the light emitting display device according to an embodiment of the present disclosure, the undercut structure may include a first pattern disposed on a portion of the auxiliary power electrode, the first pattern including a same material as a material of the first protection layer, and a second pattern disposed on the first pattern to protrude from the first pattern, the second pattern including a same material as a material of the second protection layer, the undercut region may be provided under the second pattern protruding from a lateral surface of the first pattern.

In the light emitting display device according to an embodiment of the present disclosure, the metal pattern may cover at least a portion of the lateral surface of the first pattern.

In the light emitting display device according to an embodiment of the present disclosure, the metal pattern may cover at least a portion of each of an upper surface and a lateral surface of the second pattern.

In the light emitting display device according to an embodiment of the present disclosure, may further include a thin film transistor disposed on the circuit layer of the substrate, a pixel electrode disposed on the at least one protection layer and connected with the thin film transistor, an emission layer disposed on the pixel electrode, and a common electrode disposed on the emission layer, the metal pattern may be apart from the pixel electrode.

In the light emitting display device according to an embodiment of the present disclosure, the metal pattern may include a same material as a material of at least a portion of the pixel electrode.

In the light emitting display device according to an embodiment of the present disclosure, the common electrode may directly contact the metal pattern at the contact portion.

In the light emitting display device according to an embodiment of the present disclosure, the common electrode may be electrically connected with the auxiliary power electrode through the metal pattern.

The light emitting display device according to an embodiment of the present disclosure may include a substrate including an emission region and a non-emission region, an auxiliary power electrode disposed in the non-emission region, an undercut structure disposed on a portion of the auxiliary power electrode to include an undercut region, a first protection layer covering the emission region and the auxiliary power electrode of the non-emission region and including a first opening portion exposing a portion of the auxiliary power electrode at a periphery of the undercut structure, a second protection layer disposed on the first protection layer, the second protection layer including a second opening portion which is greater than the first opening portion, a metal pattern disposed on the undercut structure, the first opening portion, and the second opening portion, and a bank layer disposed on the second protection layer, the bank layer including a third opening portion exposing a portion of the metal pattern contacting the auxiliary power electrode at the periphery of the undercut structure.

In the light emitting display device according to an embodiment of the present disclosure, the metal pattern may be disposed between the bank layer and the first protection layer exposed by the second opening portion of the second protection layer.

In the light emitting display device according to an embodiment of the present disclosure, may further include a pixel electrode disposed on the second protection layer of the emission region, an emission layer disposed on the pixel electrode and the bank layer and disconnected in the undercut region of the undercut structure, and a common electrode disposed on the emission layer and electrically connected with the auxiliary power electrode through the metal pattern exposed by the emission layer, in the undercut region of the undercut structure, the metal pattern may include a same material as a material of at least a portion of the pixel electrode and may be apart from the pixel electrode.

In the light emitting display device according to an embodiment of the present disclosure, the undercut structure may include a first pattern disposed on a portion of the auxiliary power electrode, the first pattern including a same material as a material of the first protection layer, and a second pattern disposed on the first pattern to protrude from the first pattern, the second pattern including a same material as a material of the second protection layer, the undercut region may be provided under the second pattern protruding from a lateral surface of the first pattern.

In the light emitting display device according to an embodiment of the present disclosure, the metal pattern may cover at least a portion of each of an upper surface and a lateral surface of the second pattern and a lateral surface of the first pattern.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A light emitting display device comprising:
   a substrate;
   a circuit layer including an auxiliary power electrode disposed on the substrate;
   at least one protection layer covering the circuit layer;
   a contact portion passing through the at least one protection layer to expose a portion of the auxiliary power electrode;
   a metal pattern disposed on the contact portion and the at least one protection layer at a periphery of the contact portion; and
   a bank layer on the at least one protection layer at the periphery of the contact portion,
   wherein the metal pattern is between the at least one protection layer and the bank layer.

2. The light emitting display device of claim 1, wherein the metal pattern directly contacts at least a portion of the auxiliary power electrode.

3. The light emitting display device of claim 1, wherein the bank layer comprises a material which differs from a material of the at least one protection layer.

4. The light emitting display device of claim 1, wherein the at least one protection layer and the bank layer each include a slope surface, at the periphery of the contact portion.

5. The light emitting display device of claim 4, wherein a slope angle between the slope surface of the bank layer and the auxiliary power electrode is less than or equal to a slope angle between the slope surface of the at least one protection layer and the auxiliary power electrode.

6. The light emitting display device of claim 1, further comprising an undercut structure disposed on a portion of the auxiliary power electrode at the contact portion, the undercut structure including an undercut region, the undercut structure comprising a same material as a material of the at least one protection layer.

7. The light emitting display device of claim 6, wherein the undercut region is formed all over an edge of the undercut structure.

8. The light emitting display device of claim 6, wherein the undercut structure is in a cathode contact structure, and includes a passivation layer and an overcoat layer.

9. The light emitting display device of claim 6, wherein the at least one protection layer comprises:

a first protection layer disposed on the auxiliary power electrode, the first protection layer including an inorganic insulating material; and a second protection layer disposed on the first protection layer, the second protection layer including an organic insulating material.

10. The light emitting display device of claim 9, wherein the undercut structure comprises:

a first pattern disposed on a portion of the auxiliary power electrode, the first pattern including a same material as a material of the first protection layer; and a second pattern disposed on the first pattern, the second pattern protruding from the first pattern, the second pattern including a same material as a material of the second protection layer, wherein the undercut region is provided under the second pattern protruding from a lateral surface of the first pattern.

11. The light emitting display device of claim 10, wherein the metal pattern covers at least a portion of the lateral surface of the first pattern.

12. The light emitting display device of claim 10, wherein the metal pattern covers at least a portion of each of an upper surface and a lateral surface of the second pattern.

13. The light emitting display device of claim 1, further comprising:

a thin film transistor disposed on the circuit layer of the substrate;

a pixel electrode disposed on the at least one protection layer and connected with the thin film transistor;

an emission layer disposed on the pixel electrode; and a common electrode disposed on the emission layer, wherein the metal pattern is apart from the pixel electrode.

14. The light emitting display device of claim 13, wherein the metal pattern comprises a same material as a material of at least a portion of the pixel electrode.

15. The light emitting display device of claim 13, wherein the common electrode directly contacts the metal pattern at the contact portion.

16. The light emitting display device of claim 15, wherein the common electrode is electrically connected to the auxiliary power electrode through the metal pattern.

17. A light emitting display device comprising:

a substrate including an emission region and a non-emission region;

an auxiliary power electrode disposed in the non-emission region;

an undercut structure disposed on a portion of the auxiliary power electrode, the undercut structure including an undercut region;

a first protection layer covering the emission region and the auxiliary power electrode of the non-emission region and including a first opening portion exposing a portion of the auxiliary power electrode at a periphery of the undercut structure;

a second protection layer disposed on the first protection layer, the second protection layer including a second opening portion which is greater than the first opening portion;

a metal pattern disposed on the undercut structure, the first opening portion, and the second opening portion; and a bank layer disposed on the second protection layer, the bank layer including a third opening portion exposing a portion of the metal pattern contacting the auxiliary power electrode at the periphery of the undercut structure, wherein the metal pattern is disposed between the bank layer and the first protection layer exposed by the second opening portion of the second protection layer.

18. The light emitting display device of claim 17, further comprising:

a pixel electrode disposed on the second protection layer of the emission region;

an emission layer disposed on the pixel electrode and the bank layer and disconnected in the undercut region of the undercut structure; and a common electrode disposed on the emission layer and electrically connected to the auxiliary power electrode through the metal pattern exposed by the emission layer, in the undercut region of the undercut structure, wherein the metal pattern comprises a same material as a material of at least a portion of the pixel electrode and is apart from the pixel electrode.

19. The light emitting display device of claim 17, wherein the undercut structure comprises:

a first pattern disposed on a portion of the auxiliary power electrode, the first pattern including a same material as a material of the first protection layer; and a second pattern disposed on the first pattern, the second pattern protruding from the first pattern, the second pattern including the same material as a material of the second protection layer, wherein the undercut region is provided under the second pattern protruding from a lateral surface of the first pattern.

20. The light emitting display device of claim 19, wherein the metal pattern covers at least a portion of each of an upper surface and a lateral surface of the second pattern and a lateral surface of the first pattern.

* * * * *